(12) United States Patent
Neumaier et al.

(10) Patent No.: US 11,910,154 B2
(45) Date of Patent: Feb. 20, 2024

(54) MEMS MICROPHONE AND PACKAGE WITH INTEGRATED PASSIVE ACOUSTIC FILTER, EXTENDED SOUNDPORT

(71) Applicant: Infineon Technologies AG, Neubiberg (DE)

(72) Inventors: Daniel Neumaier, Feldkirchen (AT); Niccoló De Milleri, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 13 days.

(21) Appl. No.: 17/658,546

(22) Filed: Apr. 8, 2022

(65) Prior Publication Data

US 2022/0369025 A1  Nov. 17, 2022

(30) Foreign Application Priority Data

May 11, 2021  (EP) .................................... 21173437

(51) Int. Cl.
*H04R 1/28* (2006.01)
*B81B 3/00* (2006.01)
*H04R 1/04* (2006.01)
*H04R 19/04* (2006.01)

(52) U.S. Cl.
CPC ......... *H04R 1/2846* (2013.01); *B81B 3/0059* (2013.01); *H04R 1/04* (2013.01); *H04R 19/04* (2013.01); *B81B 2201/0257* (2013.01); *B81B 2203/0127* (2013.01); *B81B 2203/0315* (2013.01); *H04R 2201/003* (2013.01)

(58) Field of Classification Search
CPC ........ H04R 1/2846; H04R 1/04; H04R 19/04; H04R 2201/003; H04R 1/222; H04R 1/28; H04R 1/2876; H04R 19/005; H04R 1/2869; B81B 3/0059; B81B 2201/025; B81B 2203/012; B81B 2203/031
See application file for complete search history.

(56) References Cited

U.S. PATENT DOCUMENTS

| 9,918,168 B1 | 3/2018 | Zhang et al. |
| 2016/0014530 A1 | 1/2016 | Gao |
| 2019/0261107 A1 | 8/2019 | Lesso et al. |
| 2019/0356974 A1 | 11/2019 | Loeppert et al. |

FOREIGN PATENT DOCUMENTS

| CN | 204291391 U | 4/2015 |
| EP | 3370431 A2 | 9/2018 |

*Primary Examiner* — Tuan D Nguyen
(74) *Attorney, Agent, or Firm* — Slater Matsil, LLP

(57) ABSTRACT

A MEMS device includes a package for providing an inner volume, a MEMS microphone arranged in the inner volume, a sound port through the package to the inner volume, and a passive acoustic attenuation filter acoustically coupled to the sound port.

20 Claims, 17 Drawing Sheets

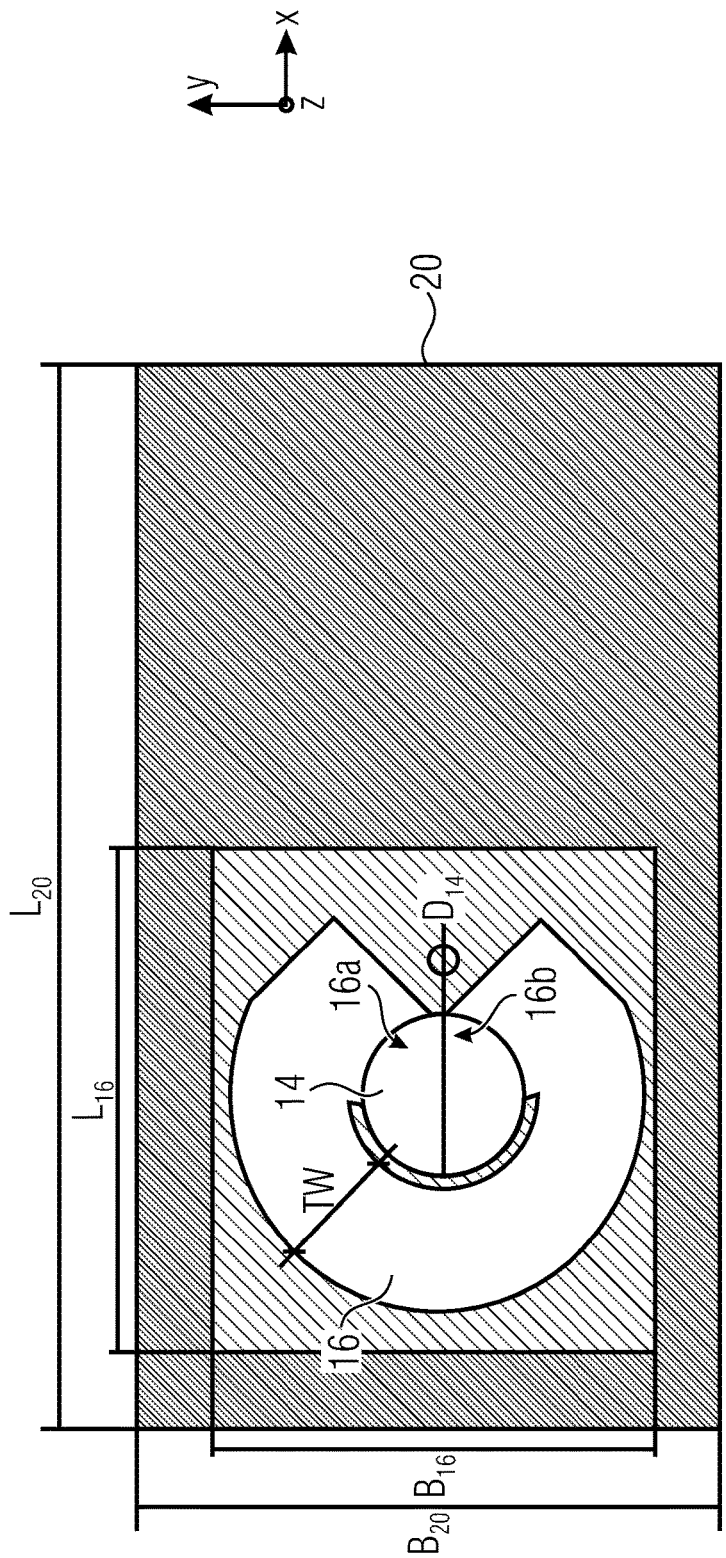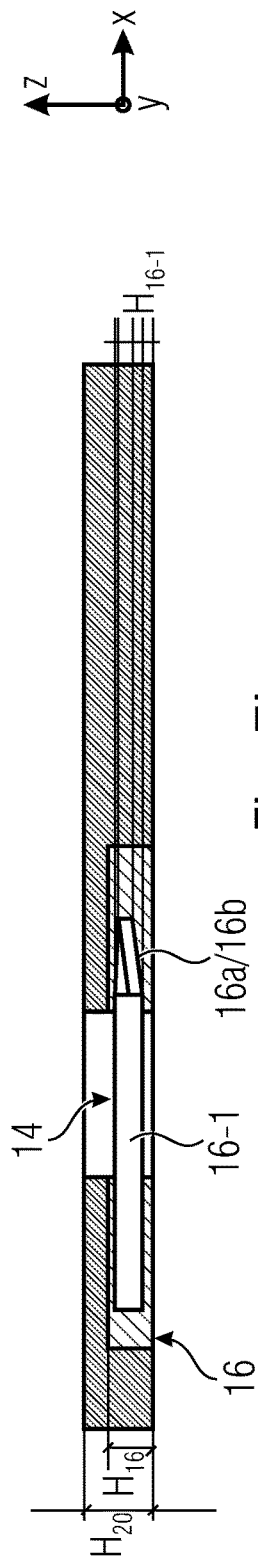
Fig. 7a
Fig. 7b

MEMS MICROPHONE AND PACKAGE WITH INTEGRATED PASSIVE ACOUSTIC FILTER, EXTENDED SOUNDPORT

CROSS-REFERENCE TO RELATED APPLICATIONS

This application claims the benefit of European Patent Application No. 21173437, filed on May 11, 2021, which application is hereby incorporated herein by reference.

TECHNICAL FIELD

Embodiments of the present disclosure relate to a MEMS device (MEMS=micro electromechanical system) with a passive acoustic attenuation filter. More specifically, embodiments relate to the field of MEMS microphones or generally of MEMS sound transducers using passive acoustic attenuation filters for shaping the frequency response behavior of the MEMS microphone. Further embodiments relate to the field of a MEMS microphone and package with integrated passive acoustic filter as an extended sound-port, such as an extended variant of an acoustic sound-port (inlet) of a MEMS microphone.

BACKGROUND

The sensitivity behavior over frequency as well as the noise behavior within an audio or ultrasonic bandwidth of a MEMS-based microphone gains more and more importance in the implementation of appropriate and very sensitive MEMS sensor devices, such as MEMS microphones, within mobile devices. MEMS microphones have specific frequency response characteristics defined by their physical properties like MEMS attributes, such as for example their sound port and ventilation hole dimensions, back volume etc. In certain applications, there is a tradeoff between physical and acoustic properties. For example, a small sound port in relation to the given package dimension could result in a low system resonance frequency, which can affect the sensitivity behavior over frequency as well as the noise within a desired audio bandwidth. Further, the system resonance can cause unwanted distortion and intermodulation effects even if it is in the ultrasonic frequency range. To shape or dampen such resonances, electrical (analog or digital) filter circuits can be implemented within the Mems device, the ASIC or somewhere externally. However, implementing electrical filter circuits can have different tradeoffs, having an influence on complexity, area, power, etc., and sometimes just touches the effect and not the root cause.

In addition, latest MEMS technology tends to have system resonances with very large Q factors that can be even critical in the higher ultrasonic range.

Therefore, there is a need in the field of MEMS devices, e.g., of MEMS microphones, to implement a MEMS device having improved operational characteristics, e.g., an improved frequency response and/or an improved adaptability of the frequency response for achieving an improved sensitivity behavior over frequency as well as of the noise behavior within an audio or ultrasonic bandwidth of the MEMS-based microphone.

Such a need can be solved by the MEMS device according to independent claim 1. Further, specific implementations of the MEMS device are defined in the dependent claims.

SUMMARY

According to an embodiment, a MEMS device comprises a package for providing an inner volume, a MEMS microphone arranged in the inner volume, a sound port through the package to the inner volume, and a passive acoustic attenuation filter acoustically coupled to the sound port.

The passive acoustic attenuation filter may comprise a tube element or an extension cavity, which branches off from the sound port. The tube element or extension cavity may have a tube length to provide an attenuation center frequency of the passive acoustic attenuation filter which corresponds to a frequency or frequency range of an acoustic resonance, e.g. of a Helmholtz resonance (peak) or a back-cavity resonance etc., in the inner volume of the MEMS device.

The passive acoustic attenuation filter may be formed as a passive acoustic notch filter acoustically coupled to the sound port, and wherein the tube element has a tube length to provide a notch center frequency of the passive acoustic notch filter which corresponds to a frequency or frequency range of a Helmholtz resonance (peak) or a back-cavity resonance in the inner volume of the MEMS device.

The tube element or extension cavity may comprise a bypass tube or bypass cavity having a bypass inlet and a bypass outlet, which are acoustically coupled to the sound port, wherein the bypass inlet is arranged in the sound port acoustically upstream to the bypass outlet (=upstream with respect to sound traveling direction into the package to the MEMS device).

According to the present concept of a MEMS device, an undesired MEMS resonance behavior can be reduced by implementing the passive acoustic attenuation filter, which is coupled to the sound port of the MEMS device. Such a package level acoustic filter can shape the frequency response of the sound signal entering the microphone package. This passive acoustic attenuation filter can be understood as an additional degree of freedom in the system design of a MEMS device, e.g., a MEMS microphone. Thus, the resonance of the MEMS device can be influenced or set with the passive acoustic attenuation filter that attenuates a resonance (peak) of the MEMS device.

In case the MEMS device is implemented as an audio MEMS microphone, the passive acoustic attenuation filter comprises a tube element, which branches off from the sound port.

BRIEF DESCRIPTION OF THE DRAWINGS

In the following, embodiments of the present disclosure are described in more detail with reference to the figures, in which:

FIGS. 7a-7b, show a schematic illustration of a MEMS device with a passive acoustic attenuation filter having a tube element in form of a Herschel-Quincke tube element exemplarily in a plan view and a cross sectional view according to an embodiment.

In the following description, embodiments are discussed in further detail using the figures, wherein in the figures and specification identical elements and elements having the same functionality and/or the same technical or physical effect are provided with the same reference numbers or are identified with the same name. thus, the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative as specific ways to make and use the present concept, and do not limit the scope of the embodiments. In the following description of embodiments, the same or similar elements having the same function have associated therewith the same reference signs or the same name, and a description of such elements will not be necessarily repeated for every embodiment. Moreover, features of the different embodiments described hereinafter may be combined with each other unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled", there are no intermediate elements. Other terms used to describe the relationship between elements should be construed in a similar fashion (e.g., "between" versus "directly between", "adjacent" versus "directly adjacent" and "on" versus "directly on", etc.).

For facilitating the description of the different embodiments, some of the figures comprise a Cartesian coordinate system x, y, z, wherein the x-y-plane corresponds, i.e. is parallel, to a first main surface region of a substrate (=a reference plane=x-y-plane), wherein the direction vertically up with respect to the reference plane (x-y-plane) corresponds to the "+z" direction, and wherein the direction vertically down with respect to the reference plane (x-y-plane) corresponds to the "−z" direction. In the following description, the term "lateral" means a direction parallel to the x- and/or y-direction, i.e. parallel to the x-y-plane, wherein the term "vertical" means a direction parallel to the z-direction.

Figure 1:
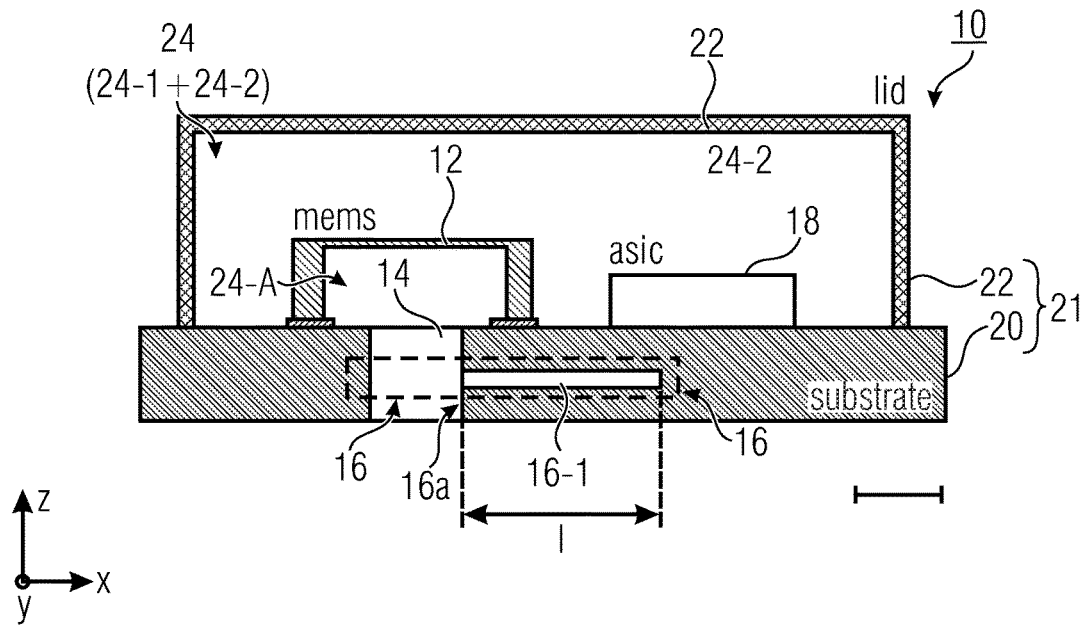
FIG. 1 shows an exemplary illustration of a MEMS device with a passive acoustic attenuation filter as a cross-sectional view, wherein tube element of the passive acoustic attenuation filter is implemented as a tube extension or an extension cavity, e.g. a λ/4 tube extension, according to an embodiment.

FIG. 1 shows an exemplary and general illustration of a MEMS device 10 with a passive acoustic attenuation filter 16 as a cross-sectional view (parallel to the x-z-axis), wherein the passive acoustic attenuation filter 16 comprises a tube extension 16-1, e.g. a tube element or an extension cavity 16-1, according to an embodiment.

According to an embodiment, the MEMS device 10 comprises a package 21 for providing an inner volume 24, a MEMS microphone (or generally a MEMS sound transducer) 12 arranged in the inner volume 24, a sound port 14 through the package 21 to the inner volume 24, and a passive acoustic attenuation filter 16 acoustically coupled to the sound port 14.

According to an embodiment, the sound port 14 (or the volume of the sound port 14) and the tube extension 16-1 of the passive acoustic attenuation filter 16 cooperate and/or interact for providing the acoustic filtering and/or attenuation effect, i.e. the passive acoustic attenuation filter functionality of the resulting passive acoustic attenuation filter 16. As discussed in detail below, the dimensions of the sound port 14 and of the tube extension 16-1 of the passive acoustic attenuation filter 16 may be adapted to each other for providing the acoustic filtering and/or attenuation effect, i.e. the passive acoustic attenuation filter functionality of the resulting filter arrangement 16.

As shown in FIG. 1, the MEMS device 10 may be arranged in the housing 21 having an interior volume 24, wherein the housing 21 has the access opening or sound port 14 to the interior volume 24 of the MEMS device 10 and the passive acoustic attenuation filter 16. The MEMS sound transducer 12 is arranged in the housing 21, for example, adjacent to the sound opening 14. The housing 21 may then comprise, for example, a substrate 20 and a cap element 22, which may be at least partially electrically conductive. In an exemplary arrangement, the MEMS sound transducer 12 (MEMS microphone) can subdivide the interior volume 24 into a front volume 24-1 and a back volume 24-2, wherein the front volume 24-1 is situated in the region between the sound port 14 and the MEMS microphone 12, and wherein the back volume 24-2 is situated on the opposite side of the MEMS sound transducer 12 with respect thereto in the interior volume 24 of the housing 21. The MEMS sound transducer 12 may comprise different configurations, such as a single membrane and single backplate (=counter-electrode) configuration, a (e.g., sealed) dual membrane configuration or a dual-backplate configuration, for example.

In the following, a number of different implementations and realizations of the passive acoustic attenuation filter 16 having a tube extension 16-4 e.g. in form of a tube element or an extension cavity 16-1, are generally described together with the technical effects thereof.

Thus, the passive acoustic attenuation filter 16 may comprise a tube element or an extension cavity 16-1 which branches off from the sound poll 14. The tube element or extension cavity 16-1 may have a tube length "1" to provide an attenuation center frequency of the passive acoustic attenuation filter 16. Thus, the tube length "1" of the tube element or extension cavity 16-1 may be set to correspond or match to a frequency or frequency range of an acoustic resonance, e.g. of a Helmholtz resonance (peak) or a back-cavity resonance etc., in the inner volume 24 of the MEMS device 10.

According to an embodiment, the passive acoustic attenuation filter 16 may be formed as a passive acoustic "notch" filter acoustically coupled to the sound port 14, wherein the tube element 16-1 has a tube length 1 to provide a notch center frequency of the passive acoustic notch filter 16. The notch center frequency of the passive acoustic notch filter 16 may be set to correspond or match to a frequency or frequency range of an acoustic resonance, e.g. a Helmholtz resonance (peak) or a back-cavity resonance, in the inner volume 24 of the MEMS device 10.

Thus, the tube element 16-1 may comprises a length "1" which corresponds to quarter of the wavelength ($=\lambda/4$) of the wavelength or of the center wavelength of a wavelength range of the sound traveling through the sound port 14 into the package 21 to the MEMS device 10 and of the (corresponding) wavelength or wavelength range of an acoustic resonance, e.g. of a Helmholtz resonance (peak) or a back-cavity resonance etc., to be acoustically attenuated in the inner volume 24 of the MEMS device 10. The tube element (tube extension or extension cavity) 16-1 has a tube inlet 16a, which is acoustically coupled or connected to the sound port 14.

Each tube element 16-1 of the plurality of tube elements 16-1 has a tube inlet 16a, which is acoustically coupled or connected to the sound port 14.

According to an embodiment, the package 21 comprises the substrate structure 20 and the lid structure 22, wherein the sound port 14 extends through the substrate structure 20, and wherein the passive acoustic attenuation filter 16 is part of the substrate structure 20. Thus, the tube element 16-1 may be integrated in the substrate structure 20, may be integrated in different layers (or planes) of the substrate structure 20 or may be attached (e.g., as an assembly part or component) to the substrate structure 20.

In the following, some further implantations and design options for the tube element or extension cavity 16-1 of the passive acoustic attenuation filter 16 are generally described.

According to a further embodiment, the passive acoustic attenuation filter 16 may comprise a plurality of tube elements 16-1 which branch off from the sound port 14. See also FIG. 2a and the associated description.

The plurality of parallel tube elements 16-1 may have the same dimensions for providing the same attenuation center frequency. Thus, each of the tube elements 16-1 may comprises a length "1" which corresponds to quarter of the wavelength ($=\lambda/4$) of the wavelength or of the center wavelength of a wavelength range of the sound traveling through the sound port 14 into the package 21 to the MEMS device 10 and of the (corresponding) wavelength or wavelength range of an acoustic resonance, e.g. of a Helmholtz resonance (peak) or a back-cavity resonance etc., to be acoustically attenuated in the inner volume 24 of the MEMS device 10.

According to a further embodiment, a subset of the plurality of parallel tube elements 16-1 may have a different dimension "l1" with respect to the remaining tube elements 16-1 for providing a different attenuation center frequency with respect to the attenuation center frequency of the remaining tube elements 16-1. Thus, a subset of the tube elements 16-1 may comprises a length "1" which corresponds to a quarter of the wavelength ($=\lambda/4$) of the wavelength or of the center wavelength of a wavelength range of the sound traveling through the sound port 14 into the package 21 to the MEMS device 10 and of the (corresponding) wavelength or wavelength range of an acoustic resonance, e.g. of a Helmholtz resonance (peak) or a back-cavity resonance etc., to be acoustically attenuated in the inner volume 24 of the MEMS device 10. A further subset of the tube elements 16-1 may comprises a length "l1" which corresponds to a quarter of the wavelength ($=\lambda/4$) of a further wavelength or of a further center wavelength of a wavelength range of the sound traveling through the sound port 14 into the package 21 to the MEMS device 10 and of the (corresponding) further wavelength or wavelength range of an acoustic resonance, e.g. of a Helmholtz resonance (peak) or a back-cavity resonance etc., to be further acoustically attenuated in the inner volume 24 of the MEMS device 10.

According to a further embodiment, the tube element or extension cavity 16-1 may alternatively comprise a bypass tube or bypass cavity having a bypass inlet and a bypass outlet, which are acoustically coupled to the sound port 14, wherein the bypass inlet is arranged in the sound port acoustically upstream to the bypass outlet (=upstream with respect to the sound traveling direction in to the package to the MEMS device). See also FIG. 2b and the associated description.

According to a further embodiment (as described in detail below), the sound port 14 may (alternatively) extend through the lid structure 22, wherein the passive acoustic attenuation filter 16 may be part of the lid structure 22. Thus, the tube element 16-1 may be integrated in the lid structure 22, may be integrated in different layers of the lid structure 22 or may be attached (e.g., as an assembly part or component) to the lid structure 22.

According to a further embodiment (as described in detail below), the passive acoustic attenuation filter 16 may be part of a filter device (e.g., an assembly part or component) attached to the package 21 at the sound port 14, wherein the filter device 16 comprises the sound port 14 and the tube element 16-1.

According to a further embodiment (as described in detail below), the tube element 16-1 of the passive acoustic attenuation filter 16 may comprise a spiral tube 16-1 extending around the sound port 14. The spiral tube 16-1 may comprise a varying or changing cross-section.

According to a further embodiment (as described in detail below), the tube element of the passive acoustic attenuation filter 16 may be filled with a medium or fluid 28 (e.g., a liquid, gas or gel) having a different speed of sound than the medium of the environmental atmosphere.

In the following, some technical effects of the above-described MEMS device 10 with passive acoustic attenuation filter 16 are summarized, wherein the passive acoustic attenuation filter 16 is acoustically coupled to the sound port 14.

The described concept of the passive acoustic attenuation filter 16 implements a package level acoustic filter into the microphones acoustic inlet (sound port 14) design, wherein the passive acoustic attenuation filter 16 can shape the frequency response of the sound signal entering the package 21 of the MEMS device 10.

The passive, acoustic filter element 16 can be understood as an additional degree of freedom in the system design of a MEMS microphone. The passive acoustic attenuation filter 16 can attenuate the MEMS device's, e.g. MEMS microphone's, resonance peak without adding noise in the band of interest.

The MEMS device 10 with the passive acoustic attenuation filter 16 can be implemented in or on the laminate (substrate structure) 20 or the lid (lid structure) 22 of the MEMS device 10 as extended variant of the standard acoustic inlet (sound port) 14. The passive acoustic attenuation filter 16 may be implemented directly with PCB manufacturing processes or by embedding/implementing dedicated acoustic filter elements 16 (filter assembly parts). These filter elements 16 may be manufactured with 3D printing, silicon-wafer, PCB, or other technologies.

Considering a conventional bottom port microphone, the passive acoustic attenuation filter 16 of the present disclosure can be implemented as a branch of the main acoustic inlet (sound port) 16 in the microphone laminate (substrate structure) 20.

Passive acoustic attenuation filters can beneficially influence system Helmholtz resonance behavior without additional power consumption of the MEMS device of otherwise necessary electronic filter circuits. Additionally or alternatively, the passive acoustic attenuation filter can, for example, attenuate standing-wave resonances in the back-cavity of the MEMS device or the eigen-resonances (=natural resonances) of the membrane (the frequency at which a system tends to oscillate in the absence of any driving or damping force).

A passive acoustic attenuation filter can be implemented as a passive acoustic notch filter.

Passive acoustic attenuation filters in a parallel configuration can target different frequencies, such as e.g. back-cavity standing waves resonances at frequencies in the ultrasound band that are independent from the end application of the MEMS device, in order to optimize the overall frequency response of the system.

Passive acoustic attenuation filter 16 does not introduce non-linear behavior or clipping and does not introduce additional noise, such as broadband noise, in the audio band.

Figure 2A:
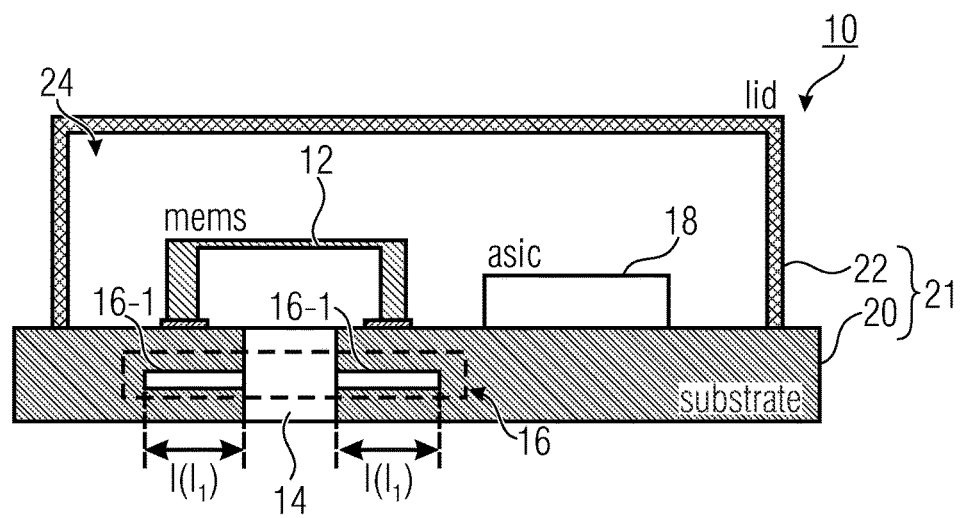
FIG. 2a shows an exemplary illustration of a MEMS device with a passive acoustic attenuation filter having a plurality of parallel λ/4 tube extensions according to a further embodiment.

FIG. 2a shows an exemplarily illustration of a MEMS device 10 with a passive acoustic attenuation filter 16 having a plurality of parallel tube extensions 16-1 according to a further embodiment. FIG. 2a shows a bottom port configuration, wherein the sound port 14 extends through the substrate structure 20.

According to the further embodiment, the passive acoustic attenuation filter 16 may comprises a plurality of tube elements 16-1 which branch off from the sound port 14.

The plurality of parallel tube elements 16-1 may have the same dimensions for providing the same attenuation center frequency. Thus, each of the tube elements 16-1 may comprises a length "1" which corresponds to quarter of the wavelength ($=\lambda/4$) of the wavelength or of the center wavelength of a wavelength range of the sound traveling through the sound port 14 into the package 21 to the MEMS device 10 and of the (corresponding) wavelength or wavelength range of an acoustic resonance, e.g. of a Helmholtz resonance (peak) or a back-cavity resonance etc., to be acoustically attenuated in the inner volume 24 of the MEMS device 10.

According to a further embodiment, a subset of the plurality of parallel tube elements 16-1 may have a different dimension "l1" with respect to the remaining tube elements 16-1 for providing a different attenuation center frequency with respect to the attenuation center frequency of the remaining tube elements 16-1.

Thus, a subset of the tube elements 16-1 may comprise a length "l" which corresponds to a quarter of the wavelength ($=\lambda/4$) of the wavelength or of the center wavelength of a wavelength range of the sound traveling through the sound port 14 into the package 21 to the MEMS device 10 and of the (corresponding) wavelength or wavelength range of an acoustic resonance, e.g. of a Helmholtz resonance (peak) or a back-cavity resonance etc., to be acoustically attenuated in the inner volume 24 of the MEMS device 10. A further subset of the tube elements 16-1 may comprises a length "l1" which corresponds to a quarter of the wavelength ($=\lambda/4$) of a further wavelength or of a further center wavelength of a wavelength range of the sound traveling through the sound port 14 into the package 21 to the MEMS device 10 and of the (corresponding) further wavelength or wavelength range of an acoustic resonance, e.g. of a Helmholtz resonance (peak) or a back-cavity resonance etc., to be further acoustically attenuated in the inner volume 24 of the MEMS device 10.

All the parallel configurations with the plurality of tube elements or tube extensions 16-1 can eventually be extended to arrays of acoustic filters 16 and can target one single frequency (to be attenuated), or also subsets of the branches 16-1 or each single branch can be targeting a different frequency (to be attenuated) in order to optimize the overall frequency response of the system 10. That applies for example to back-cavity standing waves resonances in the inner volume 24 that usually happen at a well-defined frequency in the ultrasound band and that is pretty much independent from the end-application of the MEMS microphone 12.

Each tube element 16-1 of the plurality of tube elements 16-1 has a tube inlet 16a, which is acoustically coupled or connected to the sound port 14.

Figure 2B:
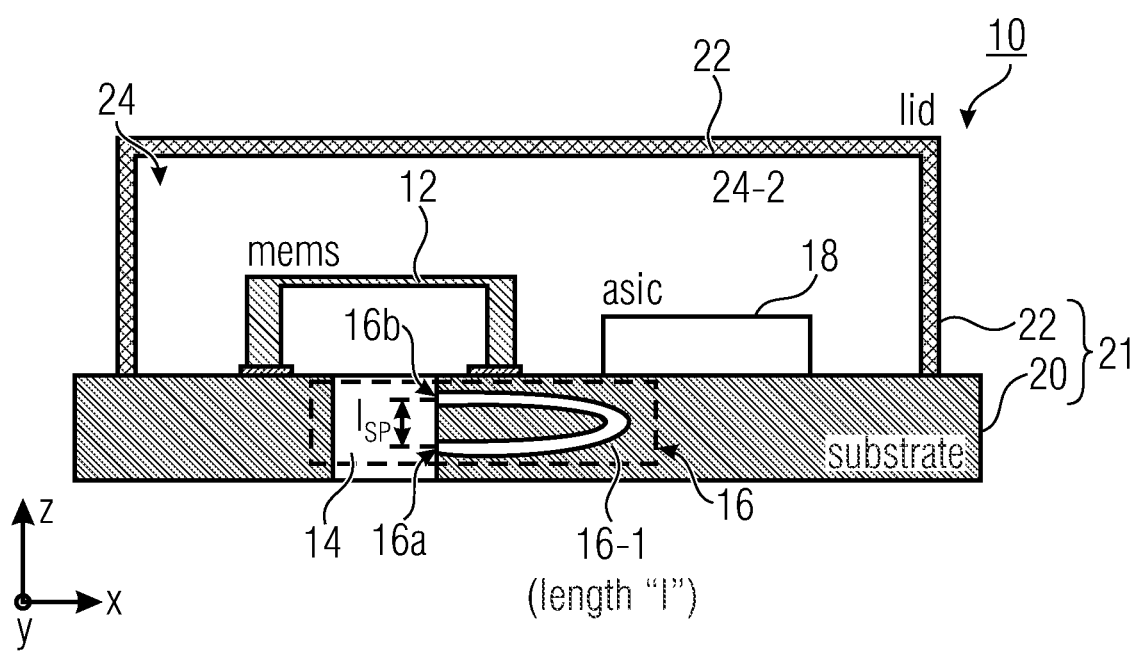
FIG. 2b shows a MEMS device with a passive acoustic attenuation filter, wherein the tube element is exemplarily implemented as a Herschel-Quincke tube according to an embodiment.

FIG. 2b shows an exemplarily MEMS device 10 with a passive acoustic attenuation filter 16 where the tube element 16-1 is exemplarily implemented as a Herschel-Quincke tube. FIG. 2b shows a bottom port configuration, where the sound port 14 extends through the substrate structure 20.

According to the embodiment of FIG. 2b, the tube element or extension cavity 16-1 of the passive acoustic attenuation filter 16 may implemented as a bypass tube or bypass cavity having a bypass inlet 16-a and a bypass outlet 16-b, which are acoustically coupled to the sound port 14. A shown in FIG. 2b, the bypass inlet 16a is arranged in the sound port 14 acoustically upstream to the bypass outlet 16b. The term "upstream" in the sound port 14 relates to the sound traveling direction into the package 21 to the MEMS device 12.

According to a further embodiment, the tube element 16-1 of the passive acoustic attenuation filter 16 may be filled with a medium or fluid 28 (e.g., a liquid, gas or gel) having a different speed of sound than the medium of the environmental atmosphere.

The tube element or extension cavity 16-1 of the passive acoustic attenuation filter 16 may be implemented as a Herschel-Quincke tube, which comprises a parallel branch 16-1 to a main acoustic path 14. Its purpose is to create an acoustic attenuation filter, e.g. an acoustic notch filter, in order to acoustically attenuate defined frequency components of an acoustic signal traveling through the acoustic system, i.e. through the sound port 14 and into the package 21. In an implementation (e.g., an ideal case), the radiuses of the parallel branch 16-1 and the main acoustic path (sound port) 14 are equal, wherein (only) plain waves are assumed to be propagating in the filter system 16 (with smooth interfaces). The parallel branch (=tube element) 16-1 comprises the length "l", wherein the (vertical) distance between the center of the bypass inlet 16-a and the center of bypass outlet 16-b, comprises the length "$l_{SP}$".

From the relation $$l - l_{SP} = (m + 1/2)\lambda$$

the minimum length of the parallel branch for the cancellation (attenuation) of the component with λ wavelength can be deducted as $$l = l_{SP} + \frac{\lambda}{2}$$

wherein "$l_{SP}$" is the length of the main acoustic path, "l" is the length of the parallel branch and "m" is an integer (with the assumption m=0). As an example, for wavelength λ in the range of 15 kHz to 60 kHz, the length l of the parallel branch 16-1 may have dimensions in the range of 3 mm to 9 mm. A sound port 14 may, for example, have a radius r of 575 μm and a length $l_{SP}$ of 200 μm with an HQ-tube 16-1 of equal cross section as the main inlet 14. For example, an attenuation of the resonance peak may be in the range of 8 dB, depending on the specific dimensions of the sound port 14 and the tube element 16-1.

Figure 2C:
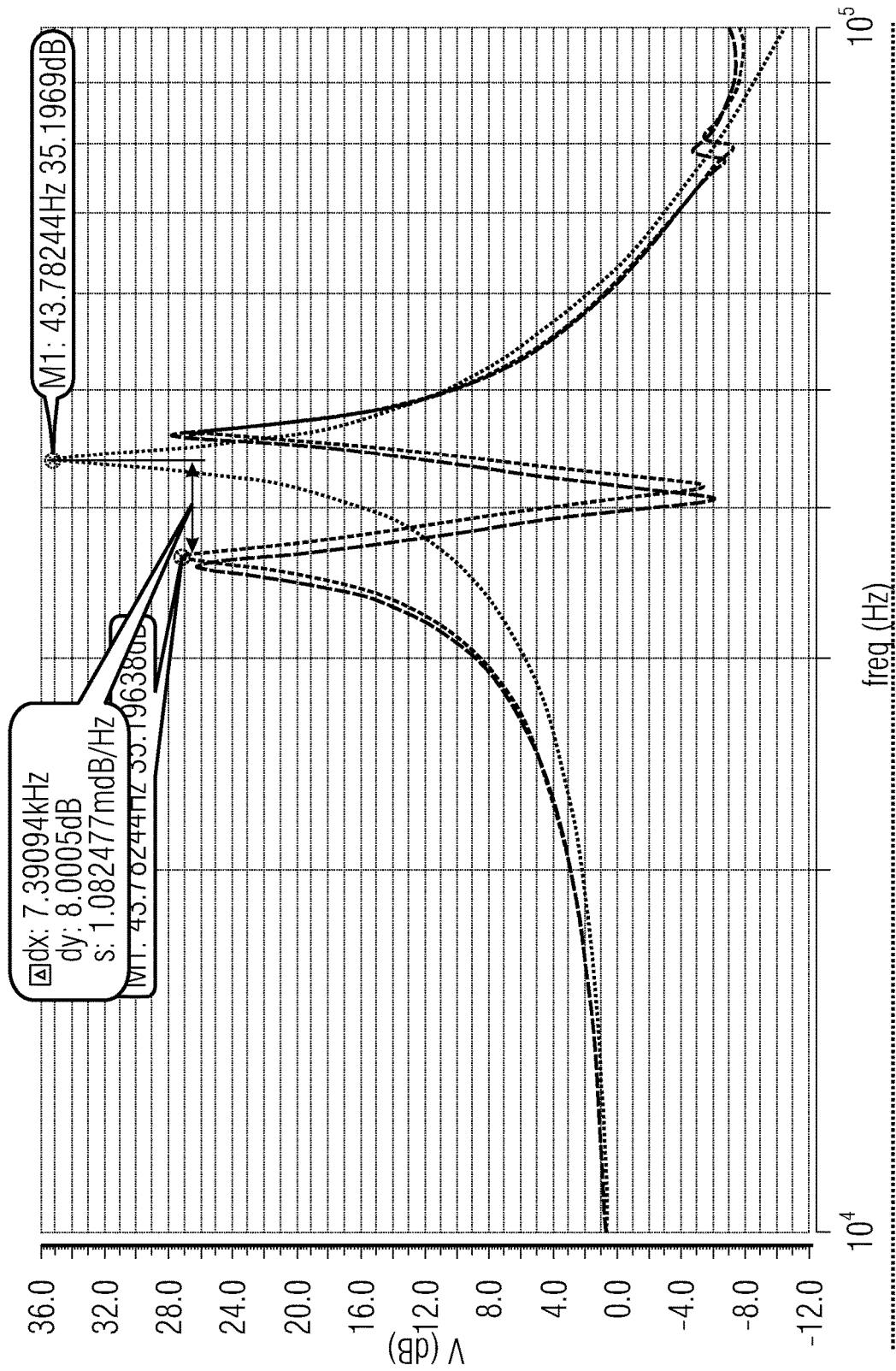
FIG. 2c shows an example of Helmholtz resonance attenuation of a typical microphone inlet with a Herschel-Quincke tube of equal cross section as the main inlet according to an embodiment.

FIG. 2c shows an example of Helmholtz resonance attenuation of a typical microphone inlet (575 μm radius 200 μm length) with a Herschel-Quincke tube 16-1 of equal cross section as the main inlet 14 according to an embodiment. In this case, the optimization brings to a Herschel-Quincke tube of 4.15 mm (~42 kHz resonance) and an attenuation of the resonance peak of 8 dB. FIG. 2c takes into account a possible (simple and inexpensive) way of producing the cavities/tubes 16-1. For example, a first PCB (=printed circuit board) is milled to form the desired cavities 16-1. Afterwards the stacking of an additional PCB finalizes the final substrate 20 in for of a PCB stack (see also FIG. 5a). This way avoids the need to etch or modify middle layers (e.g., dielectric layers) of a PCB which is complex (and expensive) and sometimes not even possible.

The geometric constraints (length "l" and cross-sectional area) for the HQ tube element 16-1 can be relaxed, for example, allowing the radius of the HQ tube element 16-1 to be different than the one of the main inlet (sound port) 14.

Figure 2D:
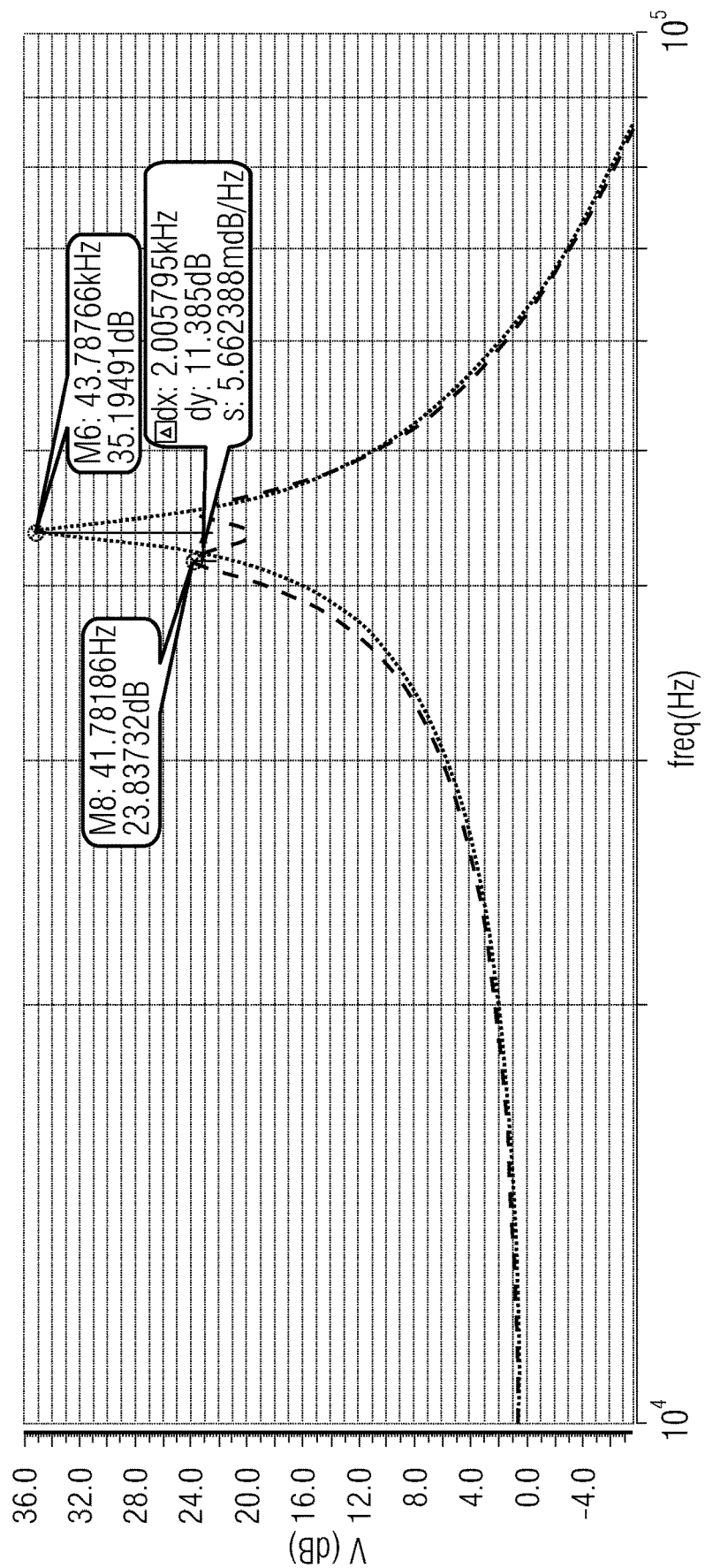
FIG. 2d shows the attenuation in a MEMS device with a passive acoustic attenuation filter where the tube element is implemented as a Herschel-Quincke tube according to an embodiment.

FIG. 2d exemplarily shows the attenuation in a MEMS device 10 with the passive acoustic attenuation filter 16 having the tube element 16-1 in form of a Herschel-Quincke tube. As is evident form the depiction in FIG. 2d, the tube element 16-1 may be tuned to attenuate the desired frequency or frequency range, comparable to a notch filter, but implemented as a passive element. The passive acoustic attenuation filter 16 may be, when implemented as a Herschel-Quincke tube 16-1, adapted to attenuate a specific frequency or a frequency band by changing the length of the parallel branch 16-1. Additionally or alternatively, the Herschel-Quincke tube may be adapted by changing the portion of the main acoustic path that is shunted by the parallel branch. The longer the shunted portion of the main acoustic path, the better is the attenuation. For the exemplary results depicted in FIG. 2d, the Herschel-Quincke tube has a radius that is less than half the radius of the sound port, here 225 μm and 575 μm, respectively. The attenuation notch becomes wider in bandwidth. An attenuation may be more effective and flat.

Embodiments of the present concept for providing the MEMS device 10 with the passive acoustic attenuation filter 16 allows to realize an attenuation of the requested frequency, frequencies or frequency ranges without a noise impact in the audio band. Considering the PSD (PSD=power spectrum density) of MEMS device 10 with the passive acoustic attenuation filter 16 having the tube element 16-1 in form of a Herschel-Quincke tube, it can be seen how there is a broadening of the resonance peak with no effect in the audio band. This (critical) feature cannot be achieved with traditional techniques which reduce the Q factor of the resonance and show a significant impact on the noise at all frequencies.

An additional optimization parameter is the portion (length $l_{SP}$) of the main inlet 14 that is shunted by the HQ-tube element 16-1. An optimization can show that the longer the shunted part $l_{SP}$ the better, but already the equi-partitioned case (⅓ of the full inlet 14) shows good results.

Figure 2E:
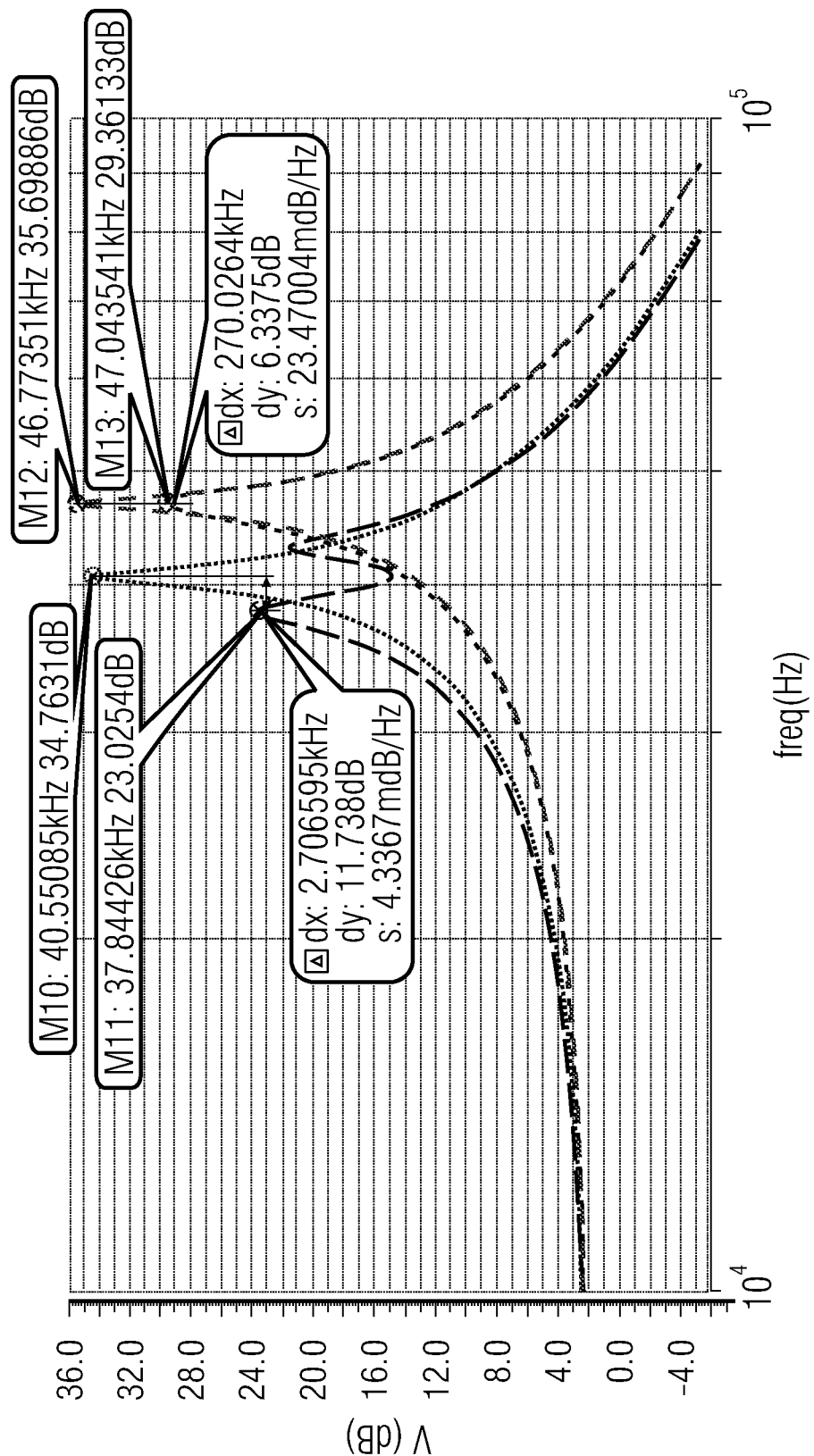
FIG. 2e shows the attenuation in a MEMS device with the passive acoustic attenuation filter having the tube element in form of a Herschel-Quincke tube in the equipartitioned case according to an embodiment.

FIG. 2e exemplarily shows the attenuation in a MEMS device 10 with the passive acoustic attenuation filter 16 having the tube element 16-1 in form of a Herschel-Quincke tube 16-1 in the equipartitioned case (⅓ of the full inlet 14).

Considering the phase delay of the wave in the added branch 16-1 and considering the basic equation for the ideal case $$l = l_{SP} + \frac{\lambda}{2} = l_{SP} + \frac{v}{2*f}$$

with "f" is fixed to the frequency to be canceled and with "v" is the speed of sound of the medium. Considering the basic equation, it can be derived that reducing "v" (=low "v") can reduce the needed length "l" for a destructive interference.

Figure 8:
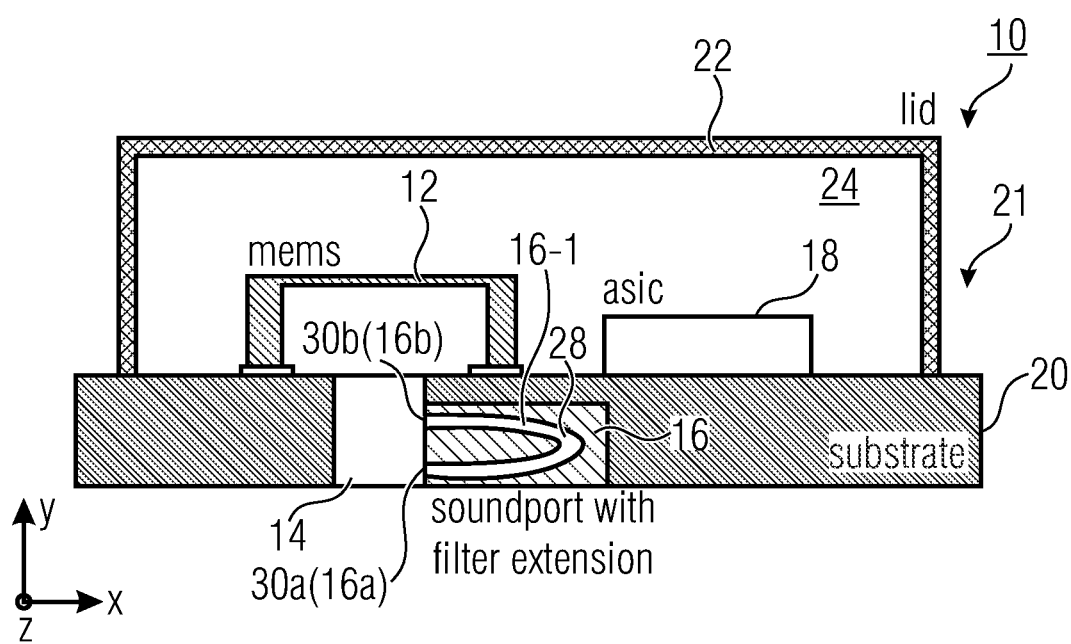
FIG. 8 shows a schematic illustration of a MEMS device with a passive acoustic attenuation filter, wherein the tube element is exemplarily implemented as a Herschel-Quincke tube and wherein the parallel branch (bypass branch) is filled with a medium, that has a different speed of sound compared to the environment medium according to an embodiment.

On the other hand, an extremely high speed of sound "v" idea may exploit another kind of tube resonance and not destructive interference. When the added path plus the shunted portion (=length $l_{SP}$) are a multiple of the wavelength "λ" (entire λ), the intuitive physical effect is that the waves travel in loop in the branch 16-1 and the shunted portion (length $l_{SP}$) of the sound-port 14 and never go to the output of the sound port 14. In addition, a small phase delay along the added tube element 16-1 may be achieved, wherein the path added by the branch 16-1 can be "neglected". This small phase delay approach (method) can additionally be enhanced by the resonance added by a membrane (=the first and second aperture interfaces 30a, 30b, as shown in FIG. 8 below, when the tube element 16-1 is filled with a medium), that is usually tuned to the application. Thus, the resulting effect is similar to a drumlike silencer.

Figure 3A:
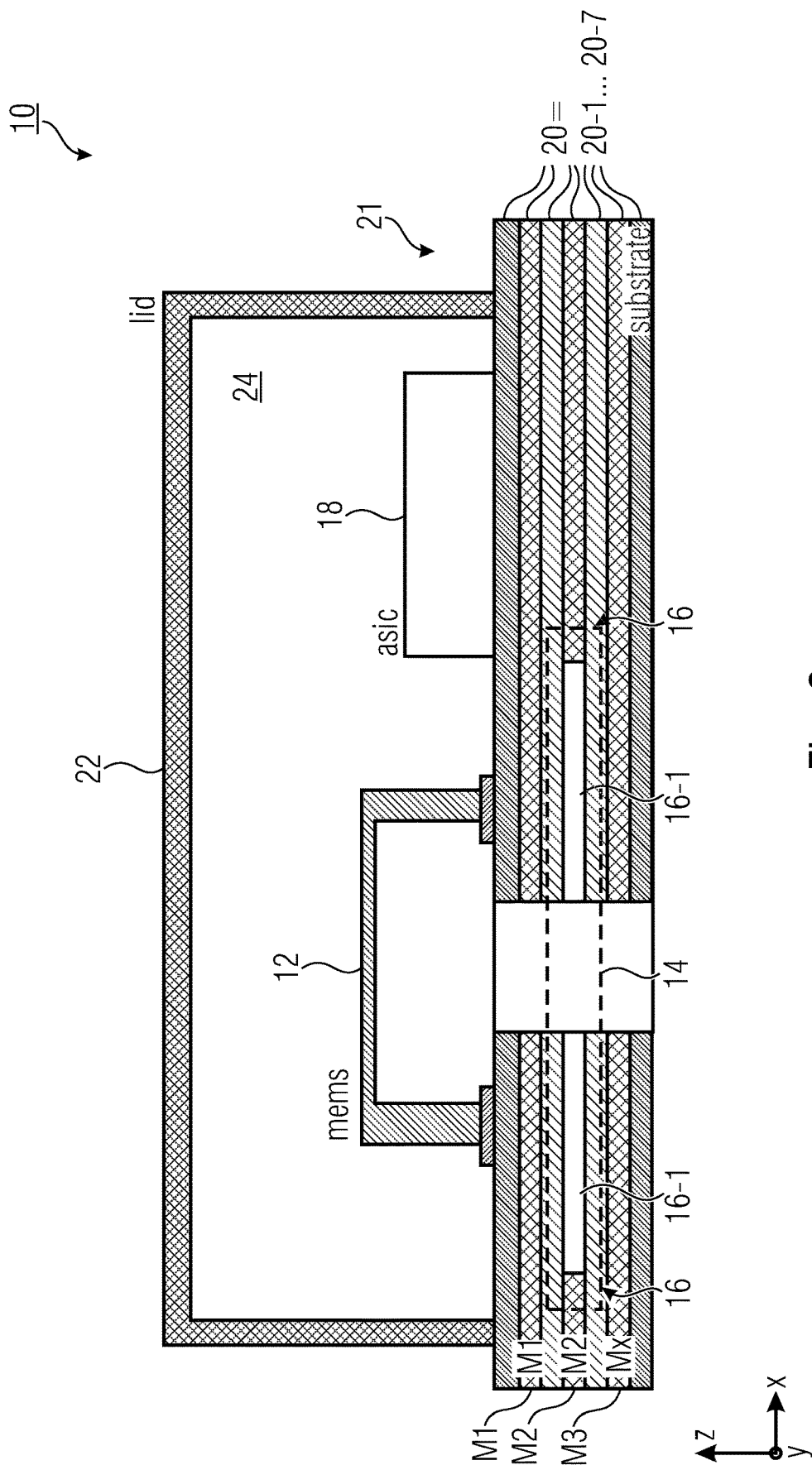
FIG. 3a shows an exemplarily schematic view of a MEMS device comprising a passive acoustic attenuation filter, wherein the tube element is implemented in the layers of a substrate structure (laminate) according to an embodiment.

FIG. 3a shows a schematic view comprising the passive acoustic attenuation filter 16 according to a further embodiment. The substrate structure 20 may comprise one or more layers of a laminate 20-1, . . . , 20-n, e.g. planes, such as n layers with n≥3, 5, 7, etc. The exemplarily depicted substrate structure comprises seven layers (n=7) of a laminate 20. The passive acoustic attenuation filter 16 may be implemented in the layers 20-n of the laminate 20.

As exemplarily shown, the substrate structure 20 may comprise metallization layers M1, M2, M3, which are separated by and/or embedded in an insulation (dielectric) material of the substrate structure 20.

According to an embodiment, the substrate structure 20 may be adapted to comprise the tube element 16-1 by structuring at least one (or a plurality) of the layers 20-n of the laminate 20. The substrate structure 20 may be adapted to comprise the tube extension 16-1, e.g. a λ/4 tube extension 16-1 within at least one of the layers 20-n of the laminate 20 that forms the substrate structure 20. There may be one or more tube elements 16-1 formed within at least a portion of a layer or layers 20-n of laminate of a substrate structure 20. FIG. 3a shows two tube elements 16-1.

The passive acoustic attenuation filter 16 can be implemented in the laminate (substrate structure) 20 of the MEMS device 10 as extended variant of the standard acoustic inlet (sound port) 14. The tube element(s) 16-1 of the passive acoustic attenuation filter 16 may be implemented directly with PCB manufacturing processes or by embedding (=implementing) dedicated acoustic filter elements 16-1.

Figure 3B:
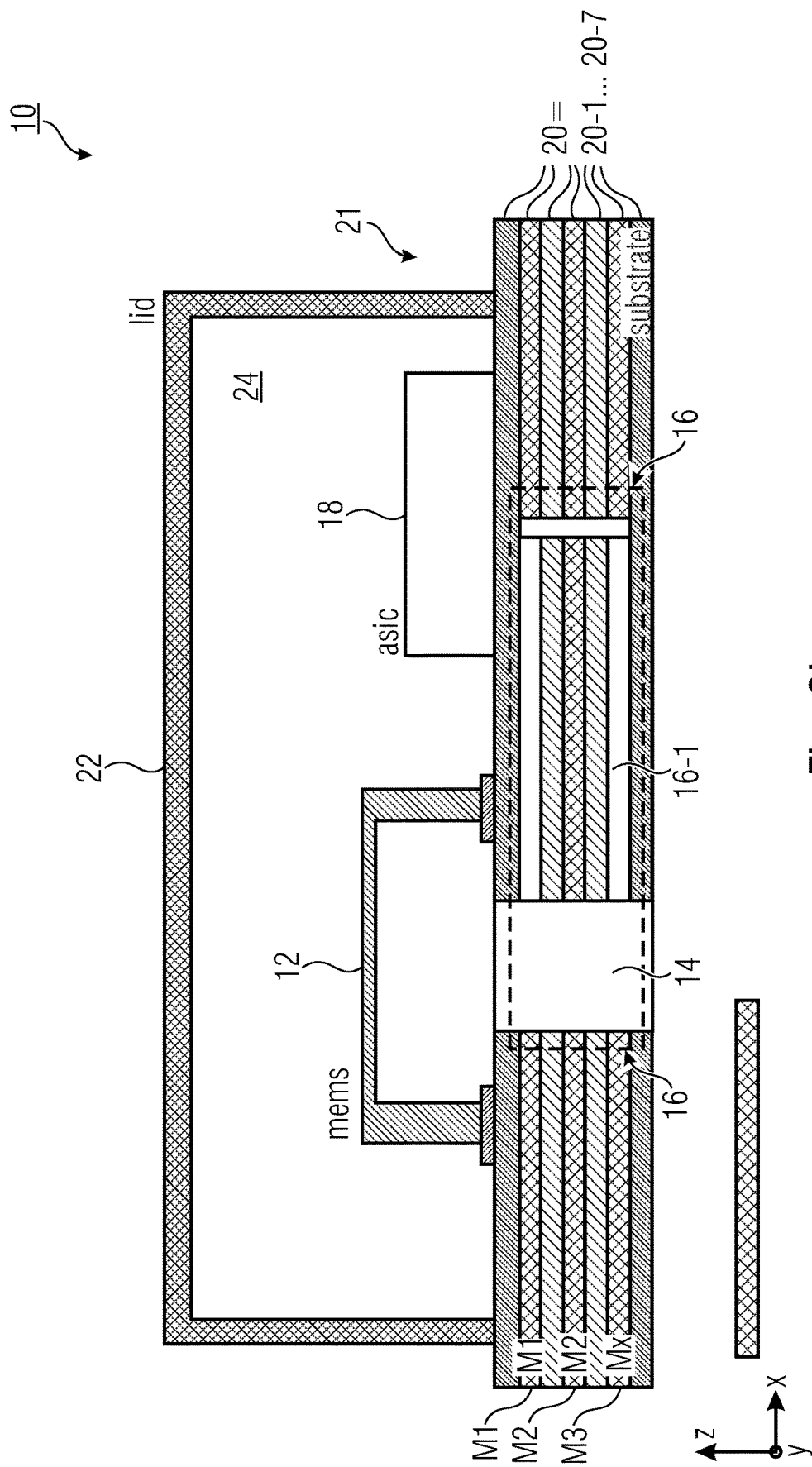
FIG. 3b shows an exemplary illustration of a MEMS device with a passive acoustic attenuation filter, wherein the tube element is implemented as a Herschel-Quincke tube in the layers of a substrate structure (laminate) according to an embodiment.

FIG. 3b shows a MEMS device 10 with a passive acoustic attenuation filter 16 where the tube element 16-1 is implemented as a Herschel-Quincke tube 16-1 in the layers of a laminate 20 configured as the substrate structure 20. The laminate 20 may comprise one or more layers 20-n.

According to an embodiment, the substrate structure 20 may be adapted to comprise the tube element 16-1 by structuring a plurality of the layers 20-n of the laminate 20. The substrate structure 20 may be adapted to comprise the tube extension 16-1, e.g. a Herschel-Quincke tube 16-1, within the layers 20-n of the laminate 20 that forms the substrate structure 20. There may be one or more tube elements 16-1 formed within at least a portion of a layer or layers 20-n of laminate of a substrate structure 20. FIG. 3b shows one tube elements 16-1.

The passive acoustic attenuation filter 16 can be implemented in the laminate (substrate structure) 20 of the MEMS device 10 as extended variant of the standard acoustic inlet (sound port) 14. The tube element(s) 16-1 of the passive acoustic attenuation filter 16 may be implemented directly with PCB manufacturing processes or by embedding (implementing) dedicated acoustic filter elements 16-1.

Figure 4A:
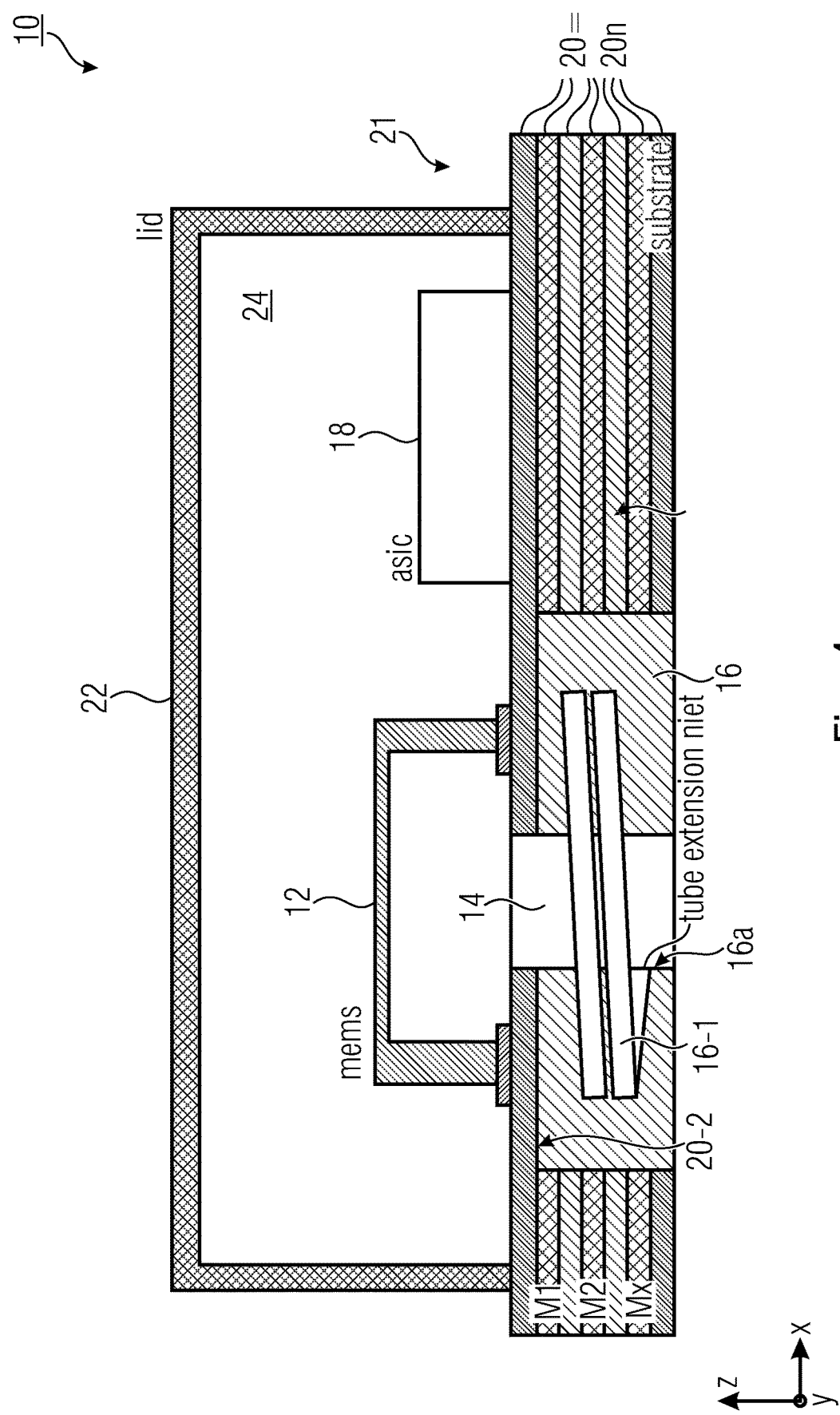
FIG. 4a shows an exemplary illustration of a MEMS device with a passive acoustic attenuation filter as a dedicated element, wherein the exemplary tube element is implemented as a λ/4 tube extension and designed as a spiral around the main inlet according to an embodiment.

FIG. 4a shows an exemplarily illustration of a MEMS device 10 with the passive acoustic attenuation filter 16 according to a further embodiment. The passive acoustic attenuation filter 16 is exemplarily implemented as a dedicated filter element (e.g., as an assembly part or component) 16 that is inserted into and fixed to a cavity or recess 20-2 of the laminate (=substrate) 20, wherein the tube element 16-1 is configured as a spiral around the main inlet 14. The depicted tube element 16-1 of the passive acoustic attenuation filter 16 is exemplarily implemented as a λ/4 tube extension.

According to an embodiment, the dedicated element (filter device) 16 may comprise the sound port 14 or at least a portion of the sound port 14 and the tube element 16-1 of the passive acoustic attenuation filter 16. The tube element 16-1 of the passive acoustic attenuation filter 16 may comprise a spiral tube 16-1 extending around the sound port 14. The spiral tube 16-1 may comprise a varying or changing cross-section.

Figure 4B:
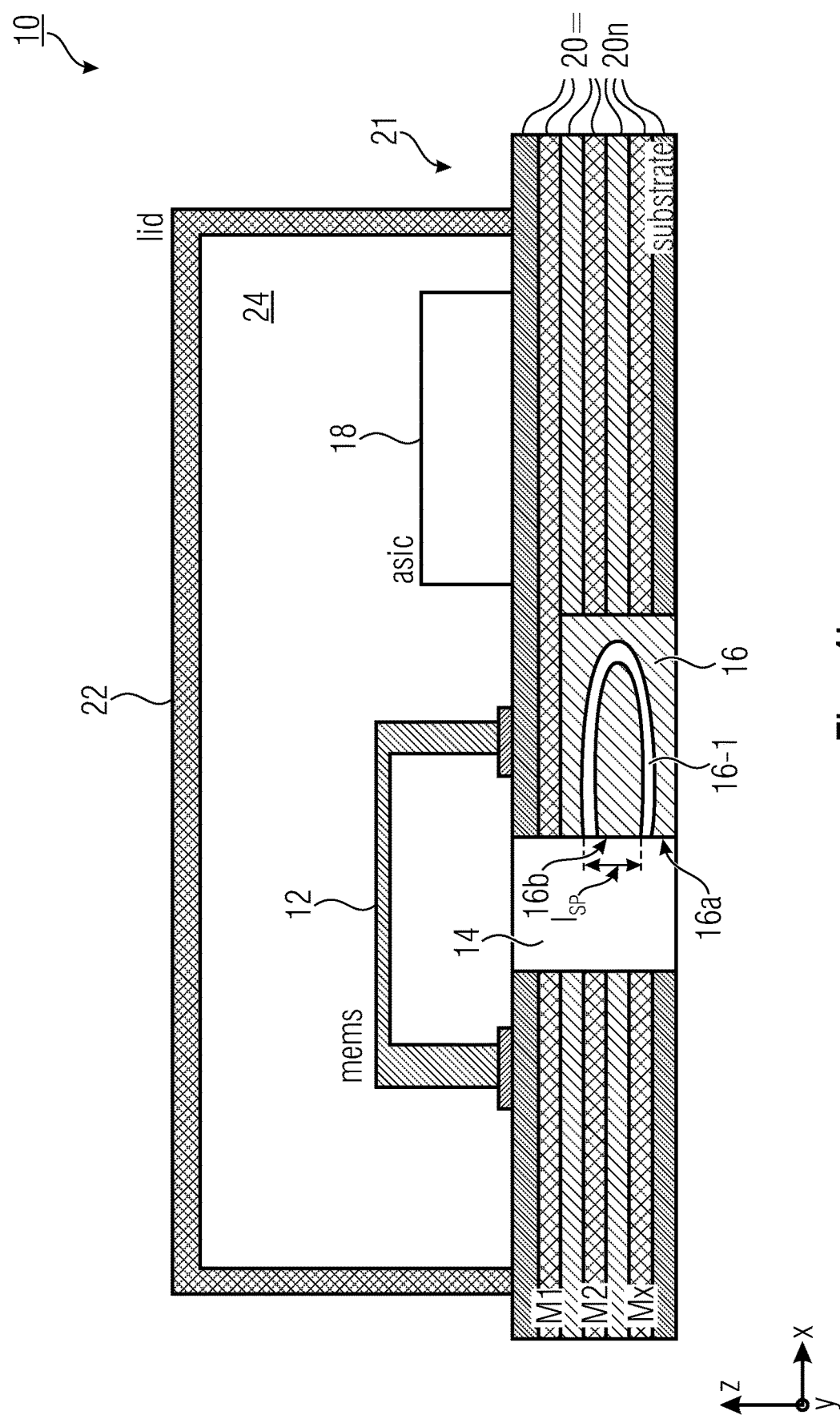
FIG. 4b shows an exemplary illustration of a MEMS device with a passive acoustic attenuation filter as a dedicated element, wherein the tube element is exemplarily implemented as a Herschel-Quincke.

FIG. 4b shows a MEMS device 10 with the passive acoustic attenuation filter 16 exemplarily implemented as Herschel-Quincke tube 16-1, such as a parallel branch 16-1, implemented as a dedicated element 16 (filter device) that is implemented into a cavity 20-2 in the laminate 20.

According to an embodiment, the passive acoustic attenuation filter 16 with the tube element 16-1 may be implemented as a dedicated filter element (filter device) 16 that is implemented into the 20-2 cavity in the laminate 20. The dedicated element 16 may comprise the sound port 14 or at least a portion of the sound port 14 and the tube element 16-1 of the passive acoustic attenuation filter 16. The dedicated element (filter device) 16 may be arranged in the cavity or recess 20-2 in the laminate 20, such that the tube element 16-1 of the dedicated element (filter device) 16 branches off from the sound port 14 and is acoustically coupled to the sound port 14. The parallel branch (=tube element) 16-1 comprises the length "l", wherein the (vertical) distance between the center of the bypass inlet 16-a and the center of bypass outlet 16-b comprises the length "$l_{SP}$".

Figure 4C:
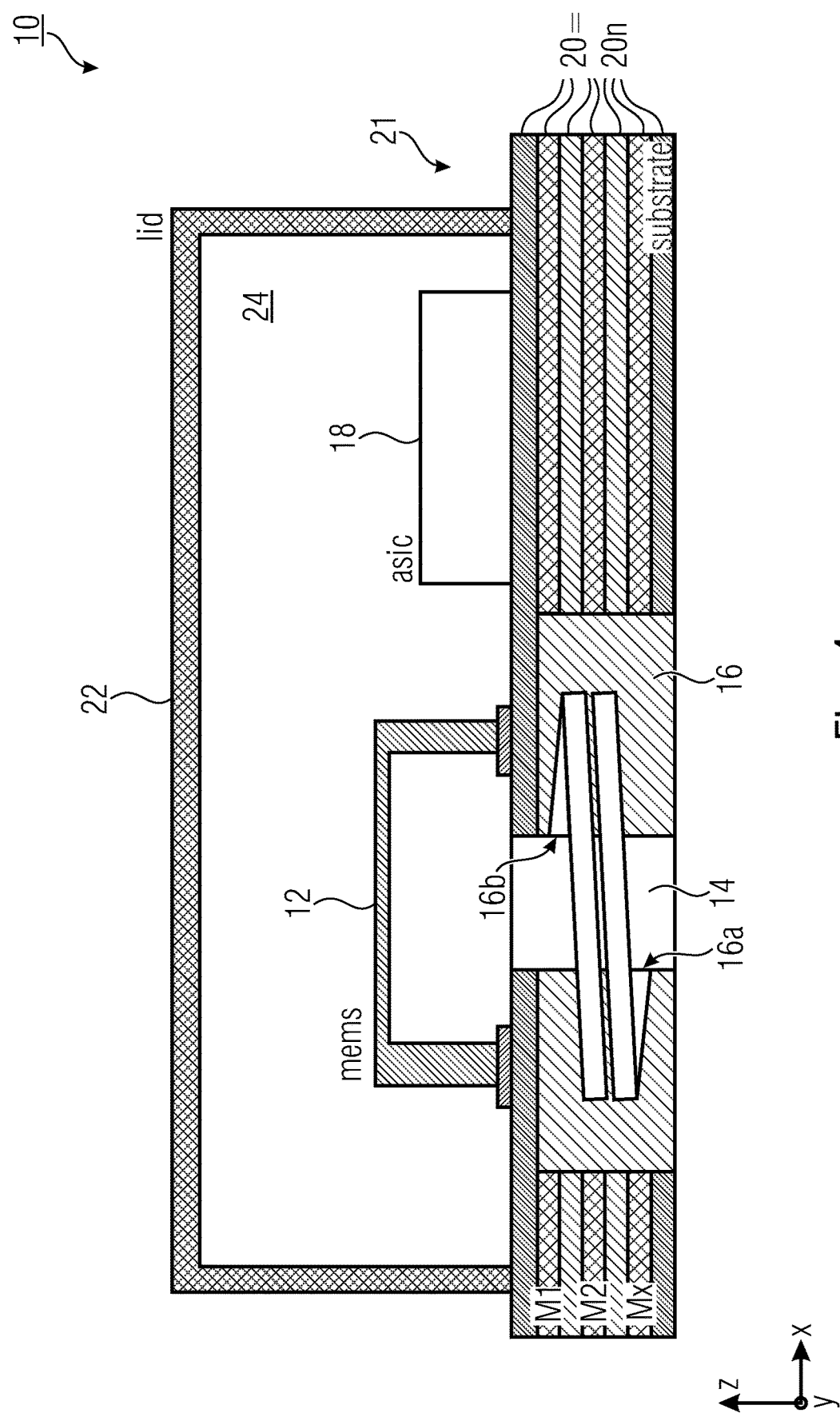
FIG. 4c shows an exemplary illustration of a MEMS device with a passive acoustic attenuation filter as a dedicated element, wherein the passive acoustic attenuation filter is implemented as a Herschel-Quincke tube and a parallel branch in a cavity in a laminate, where the parallel branch is designed as a spiral around the main inlet according to an embodiment.

FIG. 4c shows a MEMS device 10 with a passive acoustic attenuation filter 16 with a Herschel-Quincke tube and a parallel branch 16-1 as the tube element 16-1. The passive acoustic attenuation filter 16 is implemented as a dedicated element (filter device) 16 that is implemented into the cavity or recess 20-1 in a laminate 20, wherein the parallel branch 16-1 is designed as a spiral around the main inlet (sound port) 14.

According to an embodiment, a tube element 16-1, such as a Herschel-Quincke tube, comprises a tube inlet 16-1 and a tube outlet 16-2, which are acoustically coupled to the sound port 14 wherein the tube inlet 16-a is arranged in the sound port 14 acoustically upstream to the tube outlet 16-b. The Herschel-Quincke tube 16-1 may be implemented as a spiral, e.g. helical element, around the sound port 14 with the tube inlet 16a and the tube outlet 16b acoustically coupled to the sound port 14. The parallel branch (=tube element) 16-1 comprises the length "l", wherein the (vertical) distance between the center of the bypass inlet 16-a and the center of bypass outlet 16-b comprises the length "$l_{SP}$".

As shown in FIGS. 4a-4c, the tube element 16-1 may be attached as a dedicated filter device 16, e.g. as a dedicated assembly part or component, to the substrate structure 20, e.g. to the cavity or recess 20-2 of the substrate 20. As shown in FIGS. 4a-4c, the passive acoustic attenuation filter 16 may be part of the dedicated filter device 16 mechanically fixed or attached to the package 21 at the sound port 14, wherein the filter device 16 comprises (at least partially) the sound port 14 and the tube element 16-1.

Figure 5A:
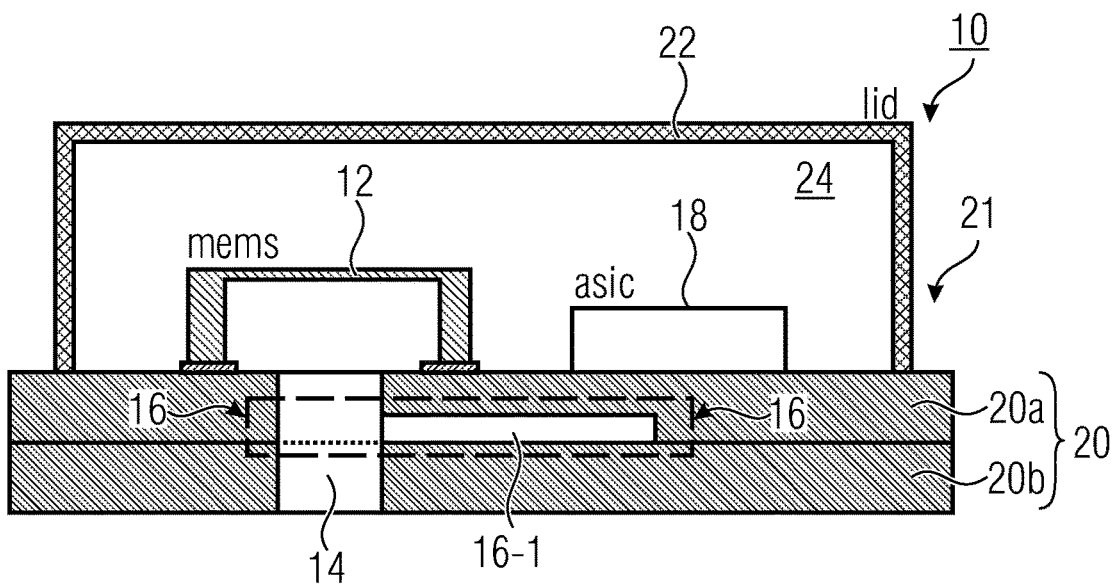
FIG. 5a shows a schematic view of a MEMS device with a passive acoustic attenuation filter, wherein the tube element is implemented as a λ/4 tube, for ex-ample, produced by milling and stacking two PCBs according to an embodiment.

FIG. 5a shows a schematic view of a MEMS device 10 with a passive acoustic attenuation filter 16 having the tube element (e.g., a λ/4 tube) 16-1. FIG. 5a shows a first layer (first PCB; PCB=printed circuit board) of a substrate structure 20 as a substrate 20a and a second layer (second PCB) of a substrate structure 20 as a substrate 10b. The tube element 16-1 may be implemented as a λ/4 tube and may be produced by milling in one or both PCBs 20a, 10b and stacking the two PCBs 20a, 20b.

Thus, the tube element 16-1 of the passive acoustic attenuation filter 16 may be integrated in the substrate structure 20 or may be integrated in different layers (or planes) of the substrate structure 20.

According to an embodiment, the tube element 16-1 of the passive acoustic attenuation filter 16 is a part of the substrate structure 20, e.g. arranged in a PCB or between two PCBs. The substrate structure 20 may be comprised of one or more substrates or one or more layers (PCBs) of the substrate. The tube element 16-1 may be integrated in the substrate structure 20.

For example, a first substrate 20a that forms the first layer (first PCB) in the substrate structure 20 may be milled and/or structured to comprise a part of the tube element 16-1 in that, when the second substrate (second PCB) 10b is attached to each other, the tube element is formed with (at the surface region of) the second substrate 10b. Alternatively, parts of the tube element 16-1 may be divided across the two or more substrates (PCBs) that form the substrate structure 20, wherein the tube element 16-1 is formed within the resulting substrate structure 20.

Figure 5B:
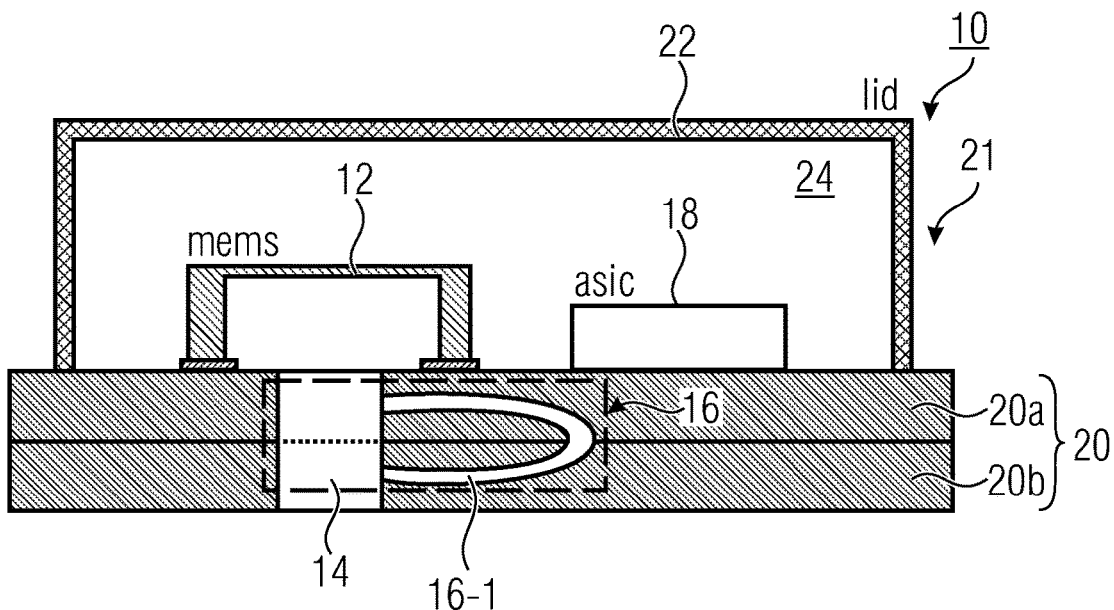
FIG. 5b shows a schematic cross-sectional view of a MEMS device with a passive acoustic attenuation filter, wherein the tube element is implemented as a Herschel-Quincke tube that is produced by milling and stacking two PCBs according to an embodiment.

FIG. 5b shows a schematic cross sectional view of a MEMS device 10 with a passive acoustic attenuation filter 16 having a Herschel-Quincke tube 16-1 as the tube element 16-1. The tube element 16-1 may be produced by milling and stacking two PCBs 20a, 10b. FIG. 5b shows a first layer (first PCB) 20a of the substrate structure 20 as a first substrate 20a and a second layer (second PCB) 10b of the substrate structure 20 as a second substrate 10b.

Thus, the tube element 16-1 of the passive acoustic attenuation filter 16 may be integrated in the substrate structure 20 or may be integrated in different layers (or planes) of the substrate structure 20.

According to an embodiment, the MEMS device 10 comprises the substrate structure 20, wherein a sound port 14 extends through the substrate structure 20 in a bottom port configuration. The passive acoustic attenuation filter 16 is an integral part of the substrate structure 20. The substrate structure 20 may be comprised of one or more substrate layers (PCBs) 20a, 10b. The first exemplarily substrate layer 20a and the second substrate layer 20b, as depicted in FIG. 5b, comprise at least a portion of a tube element 16-1, wherein, when the first substrate 20a and the second substrate 10b are attached to each other, the tube element 16-1 is formed in the resulting substrate 20 and is acoustically coupled to the sound port 14.

Figure 6A:
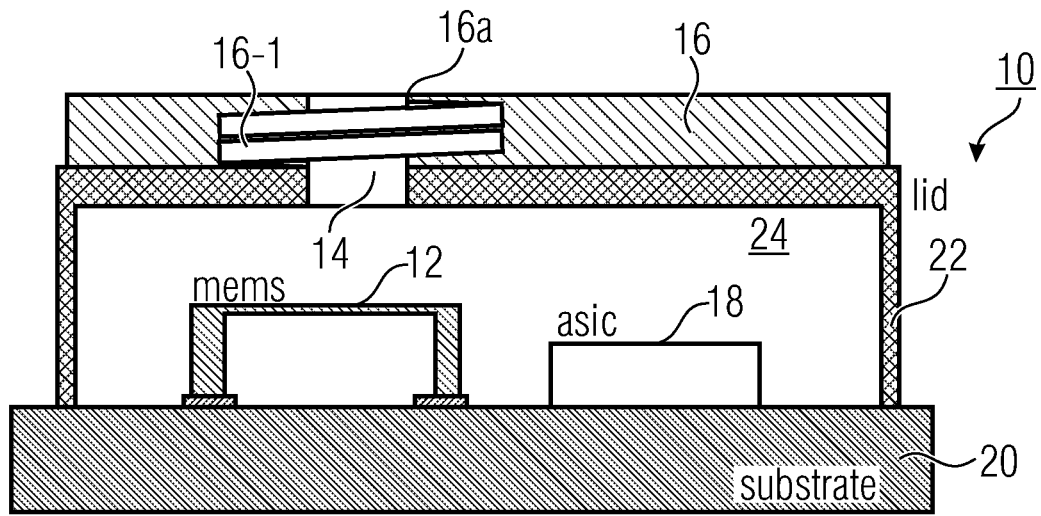
FIG. 6a shows a schematic view of a MEMS device with a passive acoustic attenuation filter implemented as a top port microphone configuration with a sound port and passive acoustic attenuation filter stacked on a lid structure according to an embodiment.

FIG. 6a shows a schematic view of a MEMS device 10 with the passive acoustic attenuation filter 16. The MEMS device 10 implemented in a top port microphone configuration with a sound port 14 and a passive acoustic attenuation filter (e.g., filter device) 16, 16 stacked on a lid structure 22.

According to an embodiment, in a top port configuration, the sound port 14 may extend through the lid structure 22 and the passive acoustic attenuation filter 16 may be part of the lid structure 22 or fixed to the lid structure 22. The passive acoustic attenuation filter 16 may be integrated in the lid structure 22, may be integrated in different layers of the lid structure 22 or may be attached (e.g., as an assembly part or component) to the lid structure 22. The passive acoustic attenuation filter 16 may be a dedicated element (filter device) 16 attached to the lid structure 22 and acoustically coupled to the sound port 14. The dedicated element 16 may be arranged at the outside of the lid structure. Alternatively, the dedicated element 16 may be arranged at the inside of the lid structure 22.

Figure 6B:
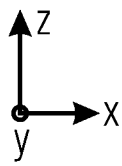
FIG. 6b shows a schematic cross-sectional view of a MEMS device with a passive acoustic attenuation filter implemented as a top port microphone with a sound port and passive acoustic attenuation filter stacked within the lid structure according to an embodiment.
Figure 6B:
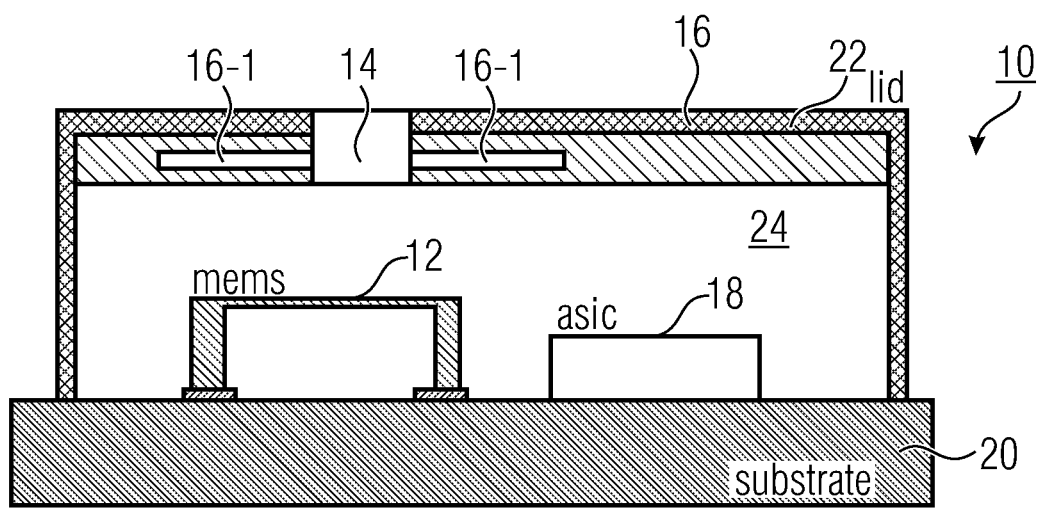

FIG. 6b shows a schematic cross-sectional view of a MEMS device 10 with the passive acoustic attenuation filter 16. The MEMS device 10 is implemented as a top port microphone with a sound port 14 and the passive acoustic attenuation filter 16 (e.g., filter device 16) stacked within (at the inside of) the lid structure 22.

According to an embodiment, in a top port configuration, the sound port 14 may extend through the lid structure 22 and the passive acoustic attenuation filter 16 may be part of or may be attached to the lid structure 22. The passive acoustic attenuation filter 16 may be integrated in the lid structure 22 or may be a dedicated element (filter device) 16 attached to the lid structure 22, wherein the tube element 16 of the passive acoustic attenuation filter 16 is acoustically coupled to the sound port 14. The dedicated element 16 may be arranged at the inside of the lid structure 22. Alternatively, the dedicated element 16 may be arranged at the outside of the lid structure 22. The passive acoustic attenuation filter 16 may comprise one or a plurality of the tube elements (tube extensions or cavity extensions) 16-1 which branch off from the sound port 14.

FIGS. 7a-7b shows a schematic illustration of a MEMS device 10 with a passive acoustic attenuation filter 16 having a tube element 16-1 in form of a Herschel-Quincke tube element exemplarily in two corresponding schematic views. The plan view of FIG. 7a exemplarily depicts a length $L_{20}$ of the substrate 20, a length Lib of a filter device 16 comprising at least partially the sound port 14 with a diameter D14 and the passive acoustic attenuation filter 16 with the tube element 16-1 in form of a Herschel-Quincke tube with a tube width TW. FIG. 7a further depicts a width $B_{20}$ of the substrate 20 and a width Bib of the passive acoustic attenuation filter 16 or the filter device 16 with the passive acoustic attenuation filter 16, respectively.

According to an embodiment, the filter device 16 with the passive acoustic attenuation filter 16 may be located within the substrate structure 20, wherein the sound port 14 may be aligned with the MEMS microphone 12 within the MEMS device 10. The height $H_{20}$, as depicted in FIG. 7b, is the height or thickness of the substrate 20, the height $H_{16}$ is the height or thickness of the filter device 16, and the height $H_{16-1}$ is the height or diameter of the tube element 16-1 within the filter device 16. The tube element 16-1 may have a square, rectangular, circular, ellipsoid cross-section or any other form or combination of forms. The dimension $D_{14}$ indicates the diameter of the sound port 14.

Thus, the tube element 16-1 of the passive acoustic attenuation filter 16 may comprise a spiral tube 16-1 extending around the sound port 14. The spiral tube 16-1 may comprise a varying or changing cross-section. According to the embodiment of FIGS. 7a-7b, the tube element or extension cavity 16-1 of the passive acoustic attenuation filter 16 may implemented as a bypass tube or bypass cavity having a bypass inlet 16-a and a bypass outlet 16-b, which are acoustically coupled to the sound port 14.

According to the embodiment, the passive acoustic attenuation filter 16 may, for example, have a sound port diameter $D_{14}$ of 1.15 mm. The tube element 16-1 may be implemented as a Herschel-Quincke tube and may for example have a width TW of the tube of 0.8 mm. The tube of the Herschel-Quincke tube element 16-1 may have a rectangular cross-section. $H_2O$ may for example be 0.45 mm, $H_{16}$ may be 0.27 mm and $H_{16-1}$ may be 0.20 mm. TW may for example be 0.8 mm. The dimensions may vary with respect to the desired wavelength to be canceled or attenuated and/or the available space within the MEMS device 10. Thus, the implemented dimensions of the MEMS device can vary at least in a range of +/−50%, +/−30% or +/−10% of the indicated dimensions.

According to the embodiment, the passive acoustic attenuation filter 16 may be attached to the housing 21 or inserted into a recess 20-2 and may comprise at least partially the sound port 14 and the annular tube element 16-1 which is provided around the sound port 14 in order to form the tube element 16-1 of the passive acoustic attenuation filter 16 acoustically coupled to the sound port 14. Starting from the sound port 14, there is an expansion of the cross section area into the tube element 16-1 in order to obtain the largest possible cross section. At the end of the tube element 16-1 there is a reduction in cross-section area at the region of the acoustic coupling with the sound port 14. The filter channel (tube element) 16-1 in between should be made as large as possible in order to provide a low acoustic resistance.

With a non-constant (=changing) cross-section (area) of the tube element 16-1 of the passive acoustic attenuation filter 16, by providing a narrower cross section at the coupling (start and ending of the tube element 16-1) and an expanding of the cross section of the tube element 16-1 as much as possible therebetween, an easier (=more effective) coupling of the tube element 16-1 to the sound-port 14 and a reduction (=minimizing) of the acoustic impedance between the sound port 14 to the tube element 16-1 may be achieved.

FIG. 8 shows a schematic illustration of a MEMS device 10 with the passive acoustic attenuation filter 16 having the tube element 16-1 in form of a Herschel-Quincke tube (a bypass branch) that may be filled with a medium or fluid 28, e.g., a liquid, gas or gel, that has a different speed of sound compared to the medium of the environmental atmosphere.

As exemplarily shown in FIG. 8, the passive acoustic attenuation filter 16 having the tube element 16-1 may be implemented as a dedicated filter element (e.g., as an assembly part or component) 16 that is implemented into a cavity or recess 20-2 of the laminate 20.

Alternatively, the MEMS device 10 of FIG. 8 may be implemented in correspondence to the MEMS device 10 of FIG. 2b with a passive acoustic attenuation filter 16 having the tube element 16-1.

FIG. 8 shows a first aperture interface 30a covering and fluidically closing the tube inlet 16a and a second aperture interface 30b covering and fluidically closing the tube outlet 16b of the tube element 16. The first and second aperture interfaces 30a, 30b provide and maintain an acoustical coupling of the sound port 14 to the tube element 16-1, which may be filled with the medium 28. The acoustical coupling of the sound port 14 to the tube element 16-1 may be achieved by means of aperture interfaces 30a, 30b which seal the tube element 16-1 and provide an (effective) acoustic impedance coupling between the sound port 14 to the tube element 16-1.

According to embodiments, the medium 28 in the tube element (filter branches) 16-1 may for example be Helium, Hydrogen, Perfluorobutane (PFB) or Sulfur Hexafluoride or the like. With the medium 28 within the tube element 16-1, a size of the passive acoustic attenuation filter 16 may be made smaller than without the medium 16 within the tube element 16-1. Additionally or alternatively, a filter frequency may be downshifted, for example by keeping or by changing the dimensions of the tube element 16-1.

Thus, the result would be to either shrink the physical dimensions of the acoustic filter 16, or to downshift the filter frequency by keeping the dimension of the acoustic filter 16. In the case of lower speed of sound gases 28 (e.g., perfluorobutane PFB or Sulfur hexafluoride) the filter branch length "l" scales directly with the speed of sound, while for high speed of sound gases 28 (e.g., hydrogen) the additional branch 16-1 needs to be as short as possible (ideally same length) compared to the main branch 14 (=the length $l_{SP}$ between the center of the bypass inlet 16-a and the center of bypass outlet 16-b).

Figure 9:
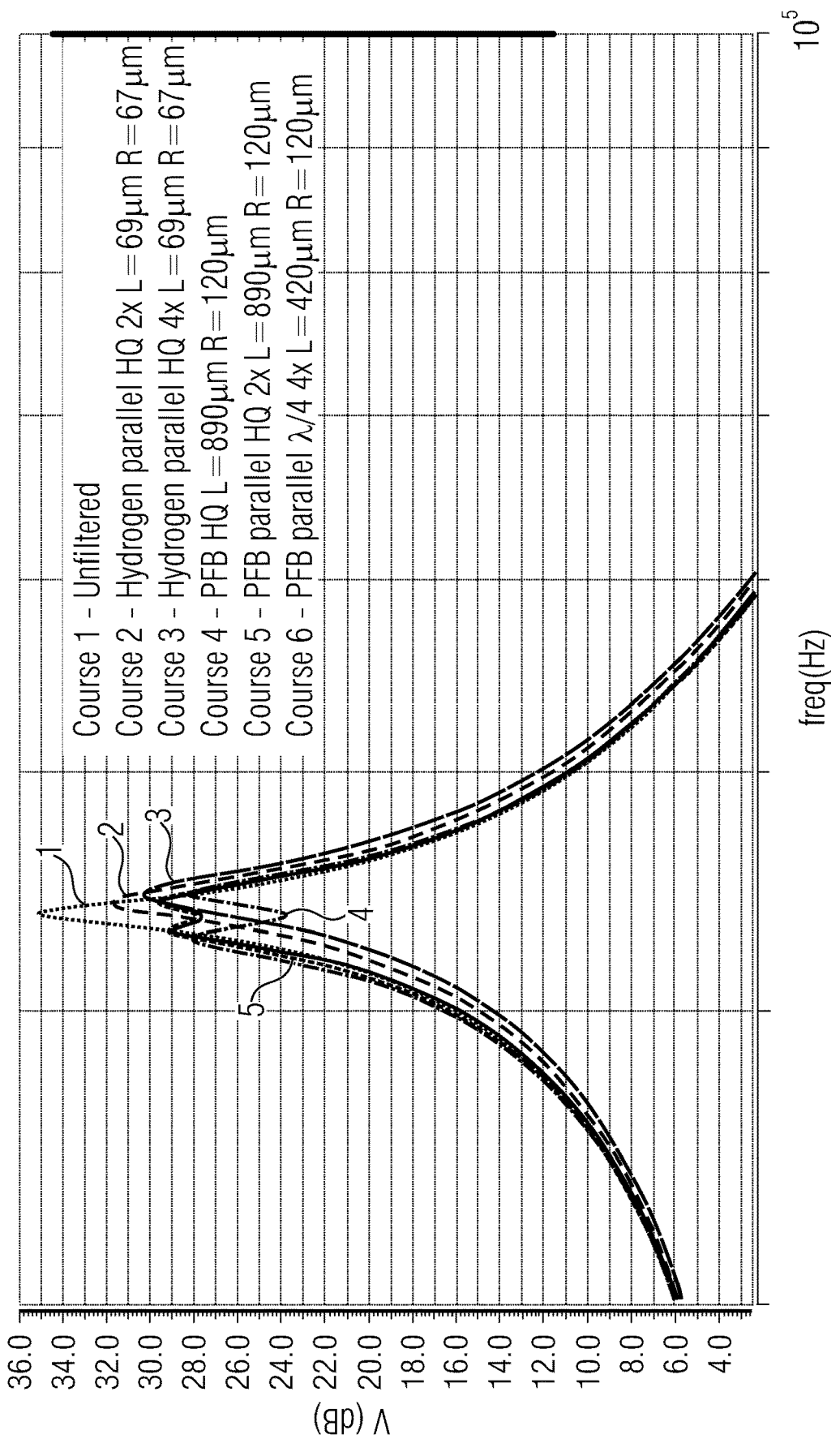
FIG. 9 shows a concept representation of one exemplary implementation option and the simulation results for the different considered cases.

FIG. 9 shows a concept representation of one exemplary implementation option and the simulation results for the different considered cases. (see courses 1 to 6 in FIG. 9)

Course 1: Unfiltered
Course 2: Hydrogen parallel HQ 2× L=69 μm R=67 μm
Course 3: Hydrogen parallel HQ 4× L=69 μm R=67 μm
Course 4: PFB HQ L=890 μM R=120 μM
Course 5: PFB parallel HQ 2× L=890 μm R=120 μm
Course 6: PFB parallel λ/4 4× L=420 μm R=120 μm As it can be seen, high speed of sound media 28 results in very compact filters 16 but slightly less effective, while low speed of sound media 28 allows the direct scaling of the branch 16-1 with the speed of sound ratio with respect to air (PFB speed of sound ~4 times lower than air so the filters are ~4 times shorter) while maintaining the excellent filtering performance.

Figure 10A:
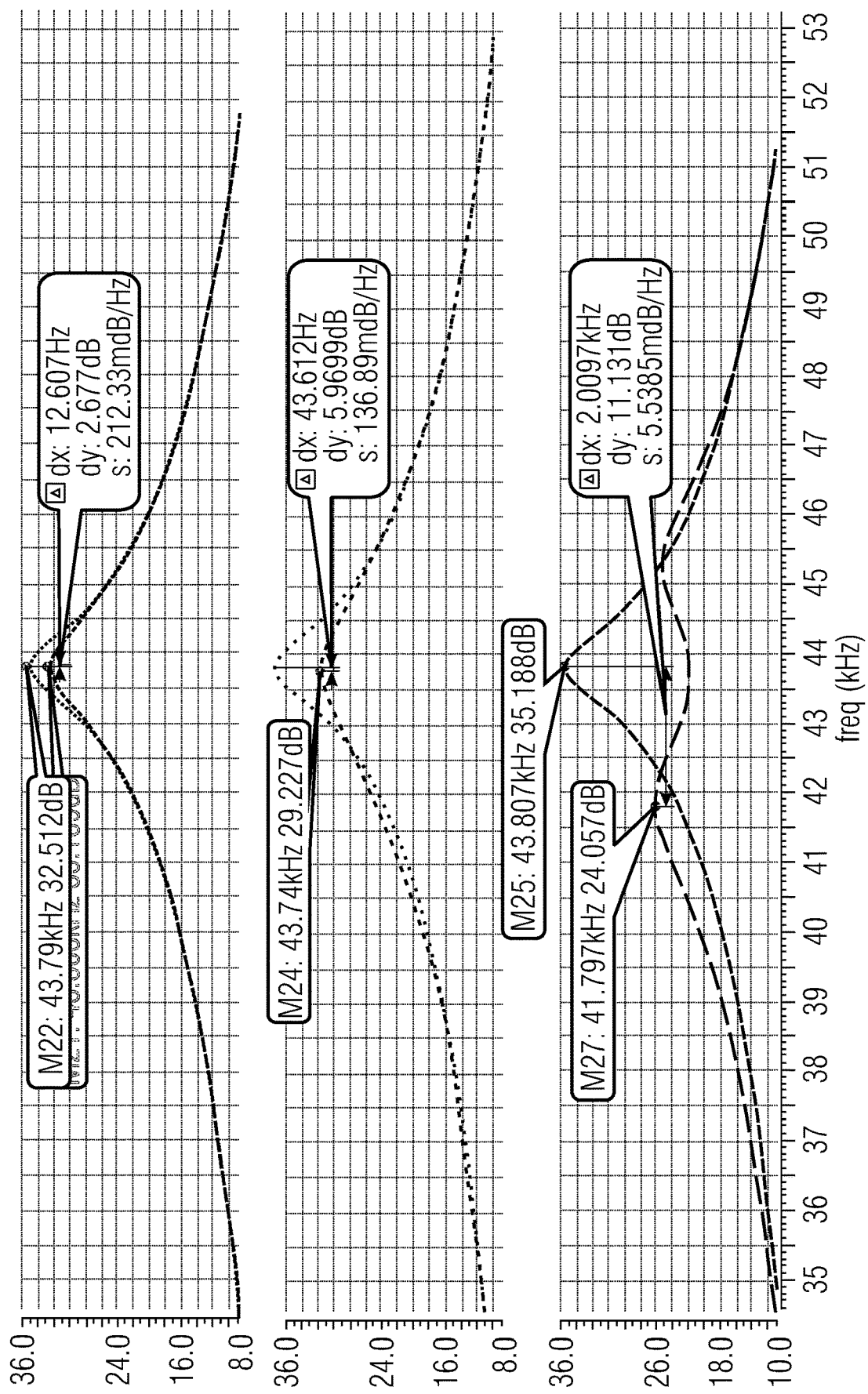
FIG. 10a shows exemplary results for a MEMS device with a passive acoustic attenuation filter where the tube elements are implemented as a λ/4 tube extensions according to an embodiment.
Figure 10B:
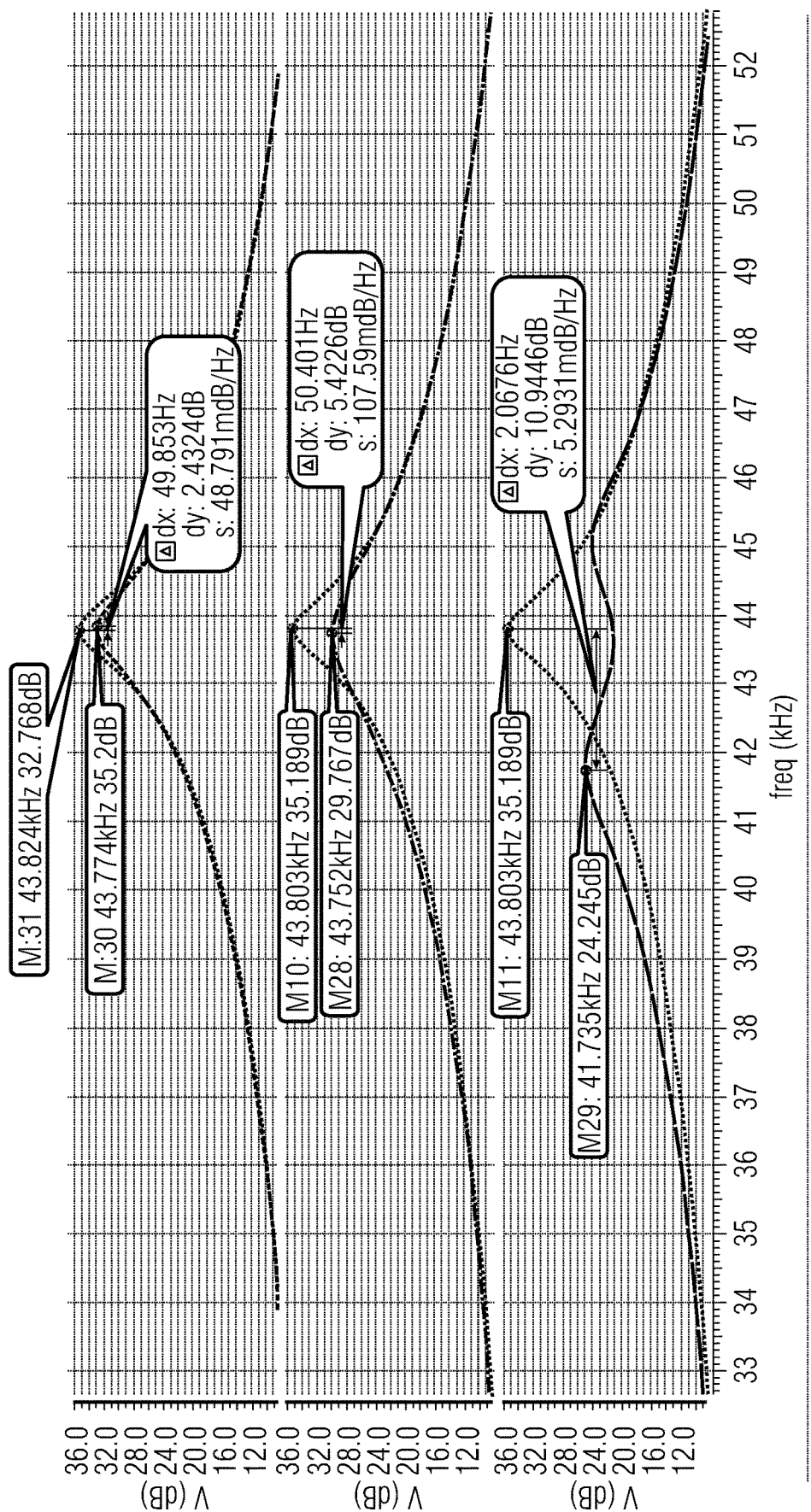
FIG. 10b shows exemplary results for a MEMS device with a passive acoustic attenuation filter where the tube elements are implemented as a λ/4 tube extensions according to an embodiment.

FIG. 10a shows three exemplary results for a MEMS device 10 with the passive acoustic attenuation filter 16 implemented as a λ/4 tube element 16-1. To be more specific, FIG. 10a shows the effect of different tubes radii from 90 μm to 125 μm to 220 μm. FIG. 10a shows the basic performance for the embodiments, and especially the importance of maximizing the radius of the branch 16-1 so to reduce the resistance and allow for larger portion of the flow to pass through the by-pass 16-1.

FIG. bob shows three exemplary results for a MEMS device 10 with the passive acoustic attenuation filter 16 implemented as a λ/4 tube element 16-1. The results were obtained using four parallel tube elements 16-1 of the same length (for the specific example of 2 mm) and different tube radii for each of the resulting graphs, respectively (here, 90, 125 and 215 µm). In comparison, it was found that λ/4 tube elements 16-1 need approximately twice as much tubes 16-1 in parallel with respect to Herschel-Quincke tubes 16-1. Implementing λ/4 tube elements 16-1 may be less complex than implementing Herschel-Quincke tubes 16-1.

The results of FIG. bob show the noise PSD (PSD=power spectral density) of one of the cases of FIG. 10a. It is clearly derivable from FIG. bob, that the effect of the passive acoustic attenuation filter 16 does not compromise the noise performance in the audio band. To be more specific, the passive acoustic attenuation filter 16 allows to realize an attenuation of the requested frequency, frequencies or frequency ranges without a noise impact in the audio band. Considering the PSD of the MEMS device 10 with the passive acoustic attenuation filter 16, it can be seen how there is a broadening of the resonance peak with no effect in the audio band.

In the following, a number of technical effects of the MEMS device 10 with the passive acoustic attenuation filter 16 are summarized.

The passive acoustic attenuation filter 16 can beneficially influence system Helmholtz resonance behavior without additional power consumption of the MEMS device of otherwise necessary electronic filter circuits.

The system Helmholtz resonance behavior can be controlled by the passive acoustic attenuation filter 16, even if there are external physical requirements for the MEMS package. In addition, attention on the detailed ultrasound behavior of the audio system may be achieved with the passive acoustic attenuation filter 16. Moreover, the passive acoustic attenuation filter 16 may help to prevent ASIC internal nonlinear behavior/clipping of even physical nonlinear behavior/clipping of the MEMS component without additional power consumption.

The passive acoustic attenuation filter 16 allows to shape the frequency response behavior of the MEMS microphone very early, i.e. at the beginning of the signal processing chain of the MEMS device 10.

Acoustic resonances (e.g., Helmholtz resonances) often occur in a MEMS microphone, which influence the signal behavior of the MEMS microphone. According to the present concept, the acoustic filter element 16 is inserted at the microphone system level in order to attenuate one or more resonance peaks (very early in the system).

The passive acoustic attenuation filter 16 is acoustically coupled to the sound port 14 of the MEMS microphone or is arranged adjacent to it and is designed as λ/4 branches 16-1 or a HQ tube (Herschel-Quincke tube) 16-1. Several acoustic filter elements 16-1 can also be combined, on the one hand to increase the filter efficiency for a certain resonance frequency and/or to attenuate several resonance frequencies (resonance states).

According to exemplary embodiments, the passive acoustic attenuation filter 16 may be inserted as an additional (independent) component in a section of the microphone package 21, e.g. in a recess 20-2 provided for this purpose, and is glued (mechanically connected) to the package 21, for example.

According to exemplary embodiments, the passive acoustic attenuation filter 16 allows to shape the frequency response of the microphone package 21, e.g. in a frequency range from 0 to 100 kHz, i.e., if possible, receive no resonances (standing acoustic waves) within the housing to avoid possible interference or negative influences on the MEMS component and/or the ASIC.

Additional embodiments and aspects are described which may be used alone or in combination with the features and functionalities described herein.

According to an embodiment, the MEMS device comprises a package for providing an inner volume, a MEMS microphone arranged in the inner volume, a sound port through the package to the inner volume, and a passive acoustic attenuation filter acoustically coupled to the sound port.

According to an embodiment, the passive acoustic attenuation filter comprises a comprises a tube element or an extension cavity which branches off from the sound port.

According to an embodiment, the tube element has a tube length to provide an attenuation center frequency of the passive acoustic attenuation filter which corresponds to a frequency of a Helmholtz resonance peak in the inner volume.

According to an embodiment, the tube element comprises a bypass tube Herschel-Quincke tube extension) having a tube inlet and a tube outlet, which are acoustically coupled to the sound port, wherein the tube inlet is arranged in the sound port acoustically upstream to the tube outlet.

According to an embodiment, the passive acoustic attenuation filter is a passive acoustic notch filter acoustically coupled to the sound port, and wherein the tube element has a tube length to provide a notch center frequency of the passive acoustic notch filter which corresponds to a frequency or frequency range of a Helmholtz resonance or a back-cavity resonance in the inner volume.

According to an embodiment, the tube element comprises a λ/4 tube extension having a tube inlet, which is acoustically coupled to the sound port.

According to an embodiment, the passive acoustic attenuation filter comprises a plurality of tube elements which branch off from the sound port.

According to an embodiment, the plurality of parallel tube elements have the same dimensions for providing the same attenuation center frequency.

According to an embodiment, a subset of the plurality of parallel tube elements has a different dimension with respect to the remaining tube elements for providing a different attenuation center frequency with respect to the attenuation center frequency of the remaining tube elements.

According to an embodiment, the package comprises a substrate structure and a lid structure, wherein the sound pulled extends through the substrate structure (bottom port configuration), and wherein the passive acoustic attenuation filter is part of the substrate structure.

According to an embodiment, the tube element is integrated in the substrate structure, is integrated in different layers (planes) of the substrate structure or is attached to the substrate structure.

According to an embodiment, the package comprises a substrate structure and a lid structure, wherein the sound port extends through the lid structure (top port configuration), and wherein the passive acoustic attenuation filter is part of the lid structure.

According to an embodiment, the tube element is integrated in the lid structure, is integrated in different layers (planes) of the lid structure or is attached to the lid structure.

According to an embodiment, the passive acoustic attenuation filter is part of a filter device attached to the package at the sound port, wherein the filter device comprises the sound port and the tube element.

According to an embodiment, the tube element of the passive acoustic attenuation filter comprises a spiral (helical) tube extending around the sound port.

According to an embodiment, the tube element of the passive acoustic attenuation filter is filled with a medium having a different speed of sound than the medium of the environmental atmosphere.

Additional embodiments and aspects are described which may be used alone or in combination with the features and functionalities described herein.

Although some aspects have been described as features in the context of an apparatus, it is clear that such a description may also be regarded as a description of corresponding features of a method. Although some aspects have been described as features in the context of a method, it is clear that such a description may also be regarded as a description of corresponding features concerning the functionality of an apparatus.

Depending on certain implementation requirements, embodiments of the control circuitry can be implemented in hardware or in software or at least partially in hardware or at least partially in software. Generally, embodiments of the control circuitry can be implemented as a computer program product with a program code, the program code being operative for performing one of the methods when the computer program product runs on a computer. The program code may, for example, be stored on a machine readable carrier.

In the foregoing detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus, the following claims are hereby incorporated into the detailed description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A MEMS device comprising:
   a package having an inner volume;
   a MEMS microphone located in the inner volume;
   a sound port through the package to the inner volume; and
   a passive acoustic attenuation filter acoustically coupled to the sound port,
   wherein the passive acoustic attenuation filter comprises a tube element branching off from the sound port,
   wherein the sound port and the tube structure are integrated into a substrate portion of the MEMS device,
   wherein the tube element has a tube inlet acoustically coupled to the sound port, the tube inlet corresponding to a cross-sectional area of the tube having a width, and wherein the width is substantially smaller than a length of the tube element.

2. The MEMS device according to claim 1, wherein the tube length is associated with an attenuation center frequency of the passive acoustic attenuation filter, the attenuation center frequency corresponding to a frequency or frequency range of an acoustic resonance in the inner volume.

3. The MEMS device according to claim 1, wherein the passive acoustic attenuation filter is a passive acoustic notch filter acoustically coupled to the sound port, and wherein the tube length is associated with a notch center frequency of the passive acoustic notch filter, the notch center frequency corresponding to a frequency or frequency range of a Helmholtz resonance or a back-cavity resonance in the inner volume.

4. The MEMS device according to claim 1, wherein the tube element comprises a bypass tube having a bypass tube inlet and a bypass tube outlet, which are acoustically coupled to the sound port, wherein the bypass tube inlet is arranged in the sound port acoustically upstream to the bypass tube outlet.

5. The MEMS device according to claim 4, wherein the bypass tube comprises a spiral tube extending around the sound port.

6. The MEMS device according to claim 1, wherein the passive acoustic attenuation filter comprises a plurality of tube elements, including the tube element, respectively branching off from the sound port.

7. The MEMS device according to claim 6, wherein at least some of the tube elements are parallel to each other and have common first dimensions associated with a first attenuation center frequency.

8. The MEMS device according to claim 7, wherein at least some of the tube elements are parallel to each other and have common second dimensions different from and in addition to the first dimensions, the second dimensions associated with a second attenuation center frequency different than the first attenuation center frequency.

9. The MEMS device according to claim 1, wherein the substrate structure comprises different individual layers, and wherein the tube element is integrated into the different individual layers of the substrate structure.

10. The MEMS device according to claim 1, wherein the tube element of the passive acoustic attenuation filter comprises a spiral tube extending around the sound port.

11. The MEMS device according to claim 1, wherein the tube element of the passive acoustic attenuation filter is filled with a medium having a different speed of sound than of the environmental atmosphere.

12. The MEMS device according to claim 1, wherein the passive acoustic attenuation filter is a notch filter enabled to attenuate an attenuation wavelength or an attenuation wavelength range.

13. The MEMS device according to claim 12, wherein the tube element extends in length a distance of ¼ of the attenuation wavelength.

14. A MEMS device comprising:
    a package for providing an inner volume wherein the package comprises a substrate structure and a lid structure;
    a MEMS microphone arranged in the inner volume;

a sound port through the package to the inner volume; and
a passive acoustic attenuation filter acoustically coupled to the sound port, wherein the passive acoustic attenuation filter comprises a tube element branching off from the sound port,
wherein the sound port extends through the lid structure, and
wherein the passive acoustic attenuation filter is integrated into the lid structure, including the tube structure.

15. The MEMS device according to claim 14, wherein the tube element has a tube inlet acoustically coupled to the sound port, the tube inlet corresponding to a cross-sectional area of the tube having a width, and wherein the width is substantially smaller than a length of the tube element.

16. The MEMS device according to claim 14, wherein the tube element comprises a spiral tube extending around the sound port.

17. The MEMS device according to claim 14, wherein the tube element comprises a bypass tube having a bypass tube inlet and a bypass tube outlet, which are acoustically coupled to the sound port, wherein the bypass tube inlet is located in the sound port acoustically upstream to the bypass tube outlet.

18. The MEMS device according to claim 17, wherein the bypass tube comprises a spiral tube extending around the sound port.

19. The MEMS device according to claim 14, wherein the passive acoustic attenuation filter comprises a plurality of tube elements, including the tube element, respectively branching off from the sound port.

20. A method for operating MEMS devices, the method comprising:
receiving sound waves at a sound port of a MEMS device formed as a package having an inner volume, a MEMS microphone located in the inner volume, the sound port extending through the package to the inner volume, and a passive acoustic attenuation filter acoustically coupled to the sound port, wherein the sound waves include at least some frequencies of a frequency range;
enabling the sound waves to be acoustically coupled by a tube element branching off from the sound port comprising the passive acoustic attenuation filter, wherein the sound port and the tube structure are integrated into a substrate portion of the MEMS device, wherein the tube element has a tube inlet acoustically coupled to the sound port, the tube inlet corresponding to a cross-sectional area of the tube having a width, and wherein the width is substantially smaller than a length of the tube element; and
based on the length and the width of the tube structure being associated with the frequency range, enabling at least some of the sound waves in the frequency range to be attenuated by the tube structure before the sound waves are received by the MEMS microphone.

* * * * *

UNITED STATES PATENT AND TRADEMARK OFFICE
CERTIFICATE OF CORRECTION

PATENT NO. : 11,910,154 B2
APPLICATION NO. : 17/658546
DATED : February 20, 2024
INVENTOR(S) : Daniel Neumaier It is certified that error appears in the above-identified patent and that said Letters Patent is hereby corrected as shown below:

In the Claims

Claim 11, Column 20; Line 54-55; delete "than of the environmental" and insert --than the environmental--.

Signed and Sealed this
Seventh Day of May, 2024

Katherine Kelly Vidal
*Director of the United States Patent and Trademark Office*